US012191126B2

(12) United States Patent
Hong et al.

(10) Patent No.: US 12,191,126 B2
(45) Date of Patent: Jan. 7, 2025

(54) PROCESS CONTROL KNOB ESTIMATION

(71) Applicant: Applied Materials, Inc., Santa Clara, CA (US)

(72) Inventors: Jeong Jin Hong, Yongin (KR); Sang Hong Kim, Seoul (KR); Mihyun Jang, Seoul (KR); Jin Kyeong Lee, Seoul (KR); Sejune Cheon, Seoul (KR)

(73) Assignee: Applied Materials, Inc., Santa Clara, CA (US)

( * ) Notice: Subject to any disclaimer, the term of this patent is extended or adjusted under 35 U.S.C. 154(b) by 229 days.

(21) Appl. No.: 17/672,595

(22) Filed: Feb. 15, 2022

(65) Prior Publication Data

US 2023/0260767 A1 Aug. 17, 2023

(51) Int. Cl.
*H01J 37/32* (2006.01)
*G05B 23/02* (2006.01)
*G06N 20/20* (2019.01)

(52) U.S. Cl.
CPC .... *H01J 37/32963* (2013.01); *G05B 23/0283* (2013.01); *G06N 20/20* (2019.01); *H01J 37/32926* (2013.01)

(58) Field of Classification Search
CPC .......... H01J 37/32963; H01J 37/32926; G05B 23/0283; G06N 20/20; G06N 3/0464; G06N 3/084; G06N 5/01; G06N 7/01; G06N 20/10
See application file for complete search history.

(56) References Cited

U.S. PATENT DOCUMENTS

| 9,972,478 B2 | 5/2018 | Guha et al. |
| 2002/0183977 A1* | 12/2002 | Sui .................... H01J 37/32963 702/188 |
| 2010/0133232 A1 | 6/2010 | Lian et al. |

(Continued)

FOREIGN PATENT DOCUMENTS

| KR | 10-2020-0035331 A1 | 4/2020 |
| WO | 2011002804 A2 | 1/2011 |

OTHER PUBLICATIONS

International Search Report and Written Opinion for the International Application No. PCT/US2023/012948, mailed on May 22, 2023, 9 pages.

*Primary Examiner* — Kidest Bahta
(74) *Attorney, Agent, or Firm* — Lowenstein Sandler LLP

(57) ABSTRACT

The subject matter of this specification can be implemented in, among other things, methods, systems, computer-readable storage medium. A method can include receiving (i) sensor data indicating a first state of an environment of a processing chamber processing a substrate subsequent to a chamber recovery procedure, and (ii) substrate process data indicating a set of process parameter values associated with performing a substrate processing procedure by the processing chamber having the environment in a second state prior to the chamber recovery procedure. The method further includes processing the sensor data and the substrate process data using one or more machine learning models to determine one or more outputs. The one or more outputs include an update to at least one of the set of process parameter values. The update is associated with performing the substrate processing procedure by the processing chamber having the environment in the first state.

15 Claims, 10 Drawing Sheets

(56) References Cited

U.S. PATENT DOCUMENTS

| | | | |
|---|---|---|---|
| 2010/0332201 A1* | 12/2010 | Albarede | H01J 37/32935 |
| | | | 703/2 |
| 2016/0132042 A1* | 5/2016 | Wu | G05B 19/41875 |
| | | | 700/121 |
| 2017/0109646 A1 | 4/2017 | David | |
| 2017/0140278 A1 | 5/2017 | Gupta et al. | |
| 2018/0356807 A1* | 12/2018 | Honda | G05B 19/41885 |
| 2020/0324410 A1* | 10/2020 | Bergantz | B25J 9/1664 |

* cited by examiner

PROCESS CONTROL KNOB ESTIMATION

TECHNICAL FIELD

The instant specification generally relates to post-preventive maintenance (PM) chamber control knob estimation. More specifically, the instant specification relates to estimating a chamber control knob setting associated with a chamber condition after performing a chamber recovery procedure such as chamber seasoning.

BACKGROUND

Substrate processing may include a series of processes that produces electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate processes, conditions of processing chambers may be altered which may result in processed substrate failing to meet desired conditions and outcomes.

One such substrate process may include plasma etching, which is a process of transferring a pattern in a layer of mask material into another layer under the mask, such as a layer of conductive or dielectric material, by removing the layered material from a surface of the wafer. Such process inevitably generates different kinds of etch by-products, such as silicon oxide and organic polymer, depending on the layered material and the etch chemistry. Some of the by-products deposit onto interior surfaces of the chamber in which the plasma etching process is performed. The deposition of the by-products may affect etch performance such as by depositing particles (e.g., flakes) onto the substrate or by reacting with the plasma and affecting the process result.

To mitigate the impact of etch by-products, preventive maintenance such as chamber cleaning may be employed to periodically remove the deposition from the chamber wall. In an exemplary illustration of chamber cleaning, the chamber is taken out of production, and a cleaning plasma, such as a $CF_4+O_2$ plasma for cleaning silicon oxide deposited during silicon etching, is introduced into the chamber. This plasma reacts with the deposition and the products of this reaction are pumped out of the chamber. After such chamber cleaning, however, it has been observed that a clean chamber wall makes the chamber unsuitable for immediate production wafer etching. Chamber seasoning is a procedure of etching a series of substrate (e.g., blank silicon wafers) to restore a chamber condition that is suitable for production substrate process. After chamber seasoning, a thin layer of silicon oxide covers the chamber wall. The chamber is then returned to production wafer etching until the next round of chamber cleaning and seasoning becomes necessary.

SUMMARY

A method and system for post preventive maintenance control knob estimation is described. In some embodiments, a method includes receiving, by a processing device, sensor data indicating a first state of an environment of a processing chamber processing a substrate subsequent to a chamber recovery procedure performed on the processing chamber. The method further includes receiving substrate process data indicating a set of process parameter values associated with performing a substrate processing procedure by the processing chamber having the environment in a second state prior to the chamber recovery procedure. The method further includes processing the sensor data and the substrate process data using one or more machine learning models (MLMs) to determine one or more outputs. The one or more outputs include a first update to at least one of the set of process parameter values. The first update may be associated with performing the substrate processing procedure by the processing chamber having the environment in the first state. The method may further include preparing a notification indicating the first update for presentation on a graphical user interface (GUI). The method may further include causing the processing chamber to perform a selection of the substrate processing procedure based on the first update.

In some embodiments, a method for training a machine learning model to predict an update to a set of process parameter values includes receiving, by a process device, training data. The training data includes first sensor data indicating a first state of an environment of a first processing chamber processing a substrate subsequent to a chamber recovery procedure performed on the first processing chamber. The training data may further include first substrate process data indicating a first set of process parameter values associated with performing a first substrate processing procedure by the first processing chamber having the environment in a second state prior to the chamber recovery procedure. The training data may further include second substrate process data indicating a first update to at least one of the first set of process parameter values. The first update may be associated with performing the first substrate processing procedure by the first processing chamber having the environment in the first state. The method further includes training, by the processing device, one or more machine learning models (MLMs) with input data and a target output. The input data includes the first sensor data and the first substrate process data. The target output may include the second substrate process data. The one or more trained MLMs may receive a new input having a new sensor data. The new sensor data may indicate a third state of the environment of a new processing chamber processing a new substrate subsequent to the chamber recovery procedure. The new sensor data may further include third substrate process data that indicates a second set of process parameter values associated with performing the first substrate processing procedure by the new processing chamber having the environment in a fourth state prior to the chamber recovery procedure to produce a new output based on the new input. The new output indicates a second update to at least one of the second set of process parameter values. The second update is associated with performing the first substrate processing procedure by the new processing chamber having the environment in the third state.

In some embodiments, the above described methods may be stored on a non-transitory machine-readable storage medium comprising instructions that, when executed by a processing device, cause the processing device to perform operations that may include one or more steps described in the preceding methods.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1:
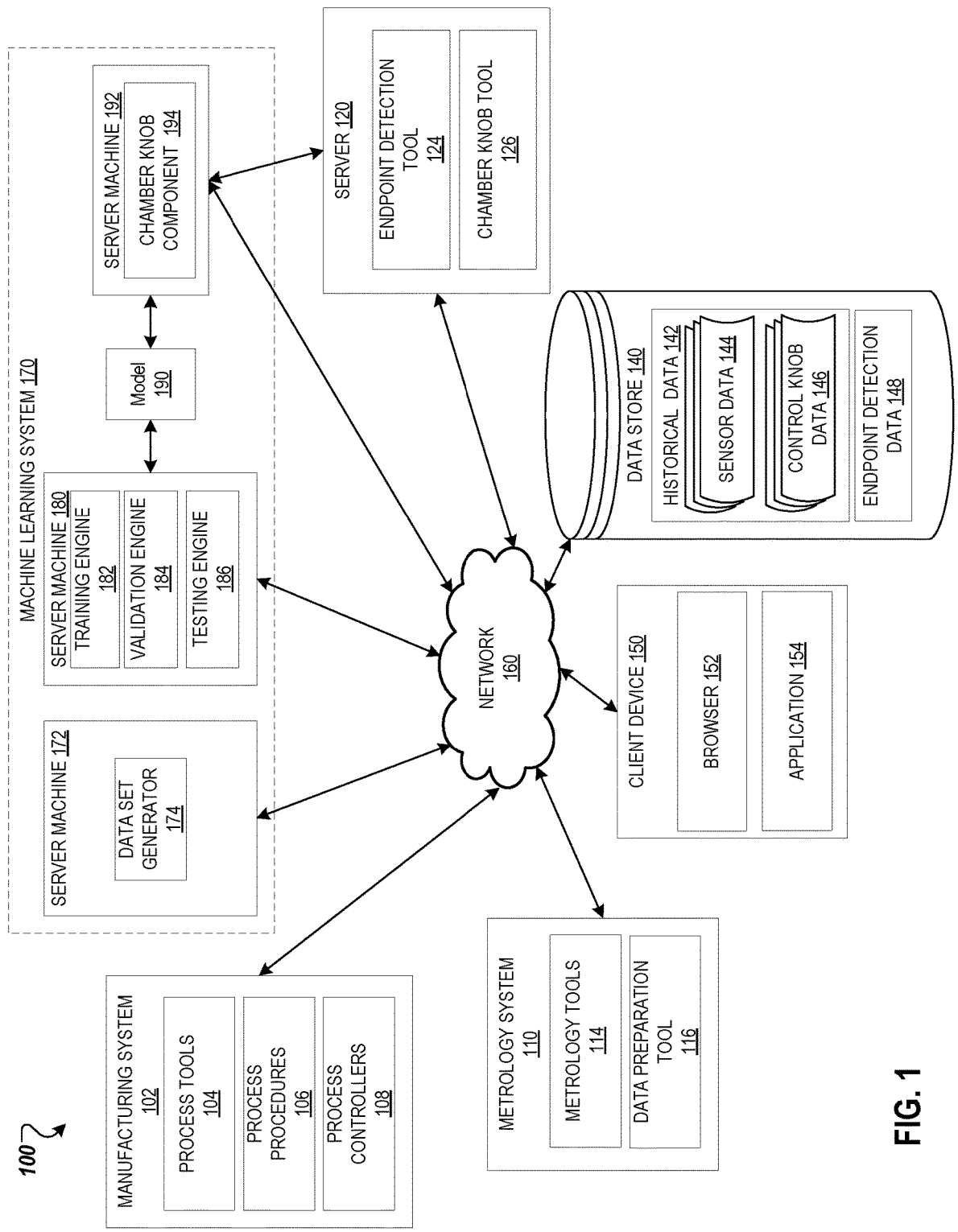
FIG. 1 is a block diagram illustrating an exemplary system architecture in which implementations of the disclosure may operate.

Substrate processing may include a series of processes that produces electrical circuits in a semiconductor, e.g., a silicon wafer, in accordance with a circuit design. These processes may be carried out in a series of chambers. Successful operation of a modern semiconductor fabrication facility may aim to facilitate a steady stream of wafers to be moved from one chamber to another in the course of forming electrical circuits in the wafer. In the process of performing many substrate procedures, conditions of processing chambers may depreciate and result in processed substrates failing to meet desired conditions or process results (e.g., critical dimensions, process uniformity, thickness dimensions, etc.).

Preventive maintenance procedures (e.g., chamber cleaning) are often used as part of a chamber recovery process to return a state of the processing chamber into a state suitable for entering a substrate processing production mode (e.g., mass processing of substrates). A recovery procedure is often used subsequent to a preventive maintenance procedure to prepare a chamber for the production mode (e.g., "warm up" the chamber). Common recovery procedures conventionally employed for chamber recovery include seasoning a processing chamber. Chamber seasoning is a procedure that includes processing a series of substrates (e.g., blank silicon wafers) to restore a chamber condition (e.g., coating the walls of the chamber) that is suitable for a production substrate process (e.g., substrates processed in the chamber having process results that meet desired threshold criteria). After chamber seasoning, a chamber may operate in a production mode for a period of time until another round of preventive maintenance and further chamber seasoning is needed or otherwise recommended to restore a state of the processing chamber.

As previously mentioned, chamber seasoning procedures include processing a series of substrates to prepare a chamber for performing a substrate processing procedure. The substrate processing procedure may include a set of conditions for the chamber (e.g., temperature, pressure, vacuum conditions, plasma conditions, etc.) that facilitate a substrate process (e.g., following one or more process procedures or recipes) to yield substrates with target process results (e.g., process results meeting threshold criteria associated with the one or more process procedures or recipes).

Conventionally, a series of substrates (e.g. seasoning wafers) are processed within a processing chamber (e.g. as part of a chamber recovery procedure) subsequent to a preventive maintenance procedure. Subsequent to processing the series of substrates, processing chamber control knobs are tuned. Processing chamber control knobs, as used herein, may include hardware and/or software elements for controlling one or more processing chamber parameters associated with processing one or more substrates within a processing chamber according to a process procedure (e.g., process recipe). The processing chamber parameters may include process parameter values such as process temperature parameter values, process pressure parameter values, process vacuum parameter values, process plasma parameter values, and process time (e.g., process duration) parameter values, among others. Conventional control knob tuning often involves altering one or more processing chamber parameters and processing a test sample. The process results (e.g., critical dimension, process uniformity, thickness dimensions, etc.) of the test sample are evaluated (e.g., using metrology tools) and compared against target process results.

For example, a test sample may include a substrate that is processed in the processing chamber and is evaluated (e.g., process results are measured) to determine whether the test sample contains process results meeting threshold conditions. If the condition(s) are not met, further tuning of the processing chamber control knobs may be performed and another test sample may be processed and evaluated to determine whether the another test sample contains process results meeting threshold conditions. This process may be repeated until a chamber control knob are tuned (e.g., processing a substrate (e.g., test sample) using the tuned control knobs results in process results meeting target conditions). Conventional methods for processing chamber recovery in preparation for production, such as previously described, can necessitate many iterations of control knob tuning including processing and evaluating of multiple test samples. Additionally, conventional methods can cause delays in returning a chamber to a production mode by waiting for test sample measurements and evaluations that are often needed to determine whether control have been effectively tuned. The time taken for the recovery procedures and chamber control knob tuning can cause a loss in productivity because a tool or chamber is down (e.g., not operating in a production mode). Furthermore, conventional methods do not provide for in-situ chamber condition monitoring but depend on processing and evaluating test samples.

Aspects and implementations of the present disclosure address these and other shortcomings of the existing technology by providing methods and systems in various embodiments capable of estimating chamber control knob settings without depending on inspection results of test samples. In some embodiments, a machine learning model may be leveraged to determine chamber control knob settings during and/or after a seasoning procedure. One of more of these aspects and/or implementations may result in reduced down time of processing tools (e.g., processing chambers) and may enable greater productivity of the manufacturing equipment (e.g. less down time).

In an exemplary embodiment, a method and system for post preventive maintenance control knob tuning is performed. In some embodiments, a method, performed by a processing device, may include receiving sensor data indicating a first state of an environment of a processing chamber. In some embodiments, the processing chamber is processing a substrate subsequent to a chamber recovery procedure performed on the processing chamber. The first state of the environment corresponds to a state of the processing chamber subsequent to a chamber seasoning operation. The method may further include receiving substrate process data. In some embodiments, the substrate process data may be indicative of a set of process parameter values associated with the processing chamber performing a substrate processing procedure. In some embodiments, the set of process parameter values may include one or more chamber control knob settings associated with a post-preventive maintenance operation of the processing chamber. The second state of the environment may be associated with a state of the processing chamber occurring prior to the performance of the chamber recovery procedure. In some embodiments, the second state of the environment is a state immediately subsequent to the performance of a preventive maintenance operation on the processing chamber. In some embodiments, the second state of the environment is a state occurring prior to any seasoning of the processing chamber.

In some embodiments, the method further includes processing the sensor data and the substrate process data using one or more machine learning models (MLMs). The method may use the one or more MLMs to determine one or more outputs. In some embodiments, the one or more outputs may include a first update to at least one of the set of process parameter values. In some embodiments, the first update is associated with the processing chamber performing the substrate processing procedure. The first update may include one or more adjustments to the chamber control knob (e.g., new chamber control values, amount of correction, etc.) settings associated with the post-preventive maintenance operation of the processing chamber (e.g., when the processing chamber is in a state occurring subsequent to the chamber recovery procedure). In some embodiments, adjusting the chamber control knob settings according to the first update puts the processing chamber in a condition suitable for production.

In some embodiments, one or more trained machine learning models receive a new input. The new input may include new sensor data indicating a third state of the environment of a new process chamber processing a new substrate subsequent to the chamber recovery procedure. The new input may include third substrate process data indicating a second set of process parameter values (e.g., chamber control knob settings) associated with performing the first substrate processing procedure by the new processing chamber having the environment in a fourth state. The fourth state may be a state occurring prior to the performance of a chamber recovery procedure (e.g., chamber seasoning). The one or more trained machine learning models may produce a new output based on the new input. The new output may indicate a second update to at least one of the second set of process parameter values (e.g., a second chamber control knob update). The second update may be associated with the new processing chamber performing the first substrate processing procedure subsequent to the chamber recovery procedure (e.g., in the third state).

In some embodiments, the method further includes preparing a notification indicating the first update for presentation on a graphical user interface (GUI). In some embodiments, the method further includes causing the processing chamber to perform a selection of the substrate processing procedure based on the first update. The selection of the substrate processing procedure may include an update to one or more process parameter values (e.g., process control knobs).

In some embodiments, the method further includes determining a first end point detection condition. The first end point detection condition may correspond to the first update. For example, the first end point detection condition may be associated with tuning of the processing chamber control knobs subsequent to a chamber recovery procedure. In certain embodiments, the first end point detection condition is an end point detection set point. In some embodiments, the first end point detection condition corresponds to an optical sensor measurement of the environment of the processing chamber. In some embodiments, the optical sensor measurement is provided by an optical emission spectra (OES) sensor and/or a reflectometry spectra sensor. The OES sensor, in some embodiments, measures an optical emission spectra of plasma disposed within the processing chamber. The reflectometry spectra sensor measures one or more spectra associated with reflecting light on a surface of substrate being processed. The optical emission spectra of the plasma may be indicative of the condition of the environment within the processing chamber.

In some embodiments, tuning of the one or more process knobs may conclude based on process results of one or more process substrate having process results meeting target conditions (e.g., within an automated process control (APC) tolerance). No further tuning of the control knobs may be necessary when a setting of the control knobs puts the processing chamber in a condition suitable for production. In some embodiments, the method further includes causing the processing chamber to perform the selection of the substrate processing procedure using the first end point detection condition.

In some embodiments, determining the first end point detection condition includes applying a deterministic model to the first update to generate the first end point detection condition. In some embodiments, the deterministic model includes a representation in which every input alters according to a specific formula, and not to random fluctuations. In some embodiments, the deterministic model may be generated using one or more historical process parameters and one or more historical end point detection conditions. In some embodiments, the historical end point detection conditions are associated with the historical process parameters. In some embodiments, the deterministic model includes a mechanistic model generated by performing at least a linear exponential regression. In some embodiments, the linear exponential regression is performed using the one or more historical process parameters and the one or more historical end point detection conditions. The mechanistic model may be based on a relationship between the historical process parameters and the historical end point detection conditions.

In some embodiments, the above described methods may be stored on a non-transitory machine-readable storage medium comprising instructions that, when executed by a processing device, cause the processing device to perform operations that may include one or more steps described in the preceding methods.

FIG. 1 is a block diagram illustrating an exemplary system architecture 100 in which implementations of the disclosure may operate. As shown in FIG. 1, system architecture 100 includes a manufacturing system 102, a metrology system 110, a client device 150, a data store 140, a server 120, and a machine learning system 170. The machine learning system 170 may be part of the server 120. In some embodiments, one or more components of the machine learning system 170 may be fully or partially integrated into client device 150. The manufacturing system 102, the metrology system 110, the client device 150, the data store 140, the server 120, and the machine learning system 170 can each be hosted by one or more computing devices including server computers, desktop computers, laptop computers, tablet computers, notebook computers, personal digital assistants (PDAs), mobile communication devices, cell phones, hand-held computers, or similar computing devices.

The manufacturing system 102, the metrology system 110, client device 150, data store 140, server 120, and machine learning system 170 may be coupled to each other via a network 160 (e.g., for performing methodology described herein). In some embodiments, network 160 is a private network that provides each element of system architecture 100 with access to each other and other privately available computing devices. In some embodiments, network 160 is a cloud-based network capable of performing cloud-based functionality (e.g., providing cloud service functionality to one or more devices in the system). Network 160 may include one or more wide area networks (WANs), local area networks (LANs), wired network (e.g., Ethernet network), wireless networks (e.g., an 802.11 network or a Wi-Fi network), cellular network (e.g., a Long Term Evolution (LTE) network), routers, hubs, switches, server computers, cloud computing networks, and/or any combination thereof. Alternatively or additionally, any of the elements of the system architecture 100 can be integrated together or otherwise coupled without the use of network 160.

The client device 150 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, cloud servers, cloud-based system (e.g., cloud service device, cloud network device), etc. The client device 150 may include a browser 152, an application 154, and/or other tools as described and performed by other systems of the system architecture 100. In some embodiments, the client device 150 may be capable of accessing the manufacturing system 102, the metrology system 110, the data store 140, server 120, and/or machine learning system 170 and communicating (e.g., transmitting and/or receiving) indications of sensor data, processed data, data classifications, chamber recovery data (e.g., recovery profiles), process result data and/or inputs and outputs of various process tools (e.g., metrology tool 114, data preparation tool 116, endpoint detection tool 124, chamber knob tool 126, and/or chamber recovery component) at various stages processing of the system architecture 100, as described herein.

As shown in FIG. 1, manufacturing system 102 includes process tools 104, process procedures 106, and process controllers 108. A process controller 108 may coordinate operation of process tools 104 to perform on one or more process procedures 106. For example, various process tools 104 may include specialized chambers such as etch chambers, deposition chambers (including chambers for atomic layer deposition, chemical vapor deposition, or plasma enhanced versions thereof), anneal chambers, and/or the like. In another example, machines may incorporate sample transportation systems (e.g., a selective compliance assembly robot arm (SCARA) robot, transfer chambers, front opening pods (FOUPs), side storage pod (SSP), and/or the like) to transport a sample between machines and process steps.

Process procedures 106 or sometimes referred to as process recipes or process steps may include various specifications for carrying out operations by the process tools 104. For example, a process procedure 106 may include process specifications such as duration of activation of a process operation, the process tool used for the operation, the temperature, flow, pressure, etc. of a machine (e.g., a chamber), order of deposition, and the like. In some embodiments, the process specifications are referred to as control knobs. In another example, process procedures may include transferring instructions for transporting a sample to a further process step or to be measured by metrology system 110. One or more process procedures 106 include preventive maintenance procedures and seasoning procedures.

Process controllers 108 can include devices designed to manage and/or coordinate the actions of process tools 104. In some embodiments, process controllers 108 are associated with a process recipe or series of process procedure instructions that when applied in a designed manner result in a desired process result of a substrate process. For example, a process recipe may be associated with processing a substrate to produce a target process results (e.g., critical dimension, thickness, uniformity criteria, etc.). Process controllers 108 can coordinate the performance of preventive maintenance procedures (e.g., chamber cleaning) and chamber recovery procedures (e.g., chamber seasoning) to return a chamber into a production state.

In some embodiments, one or more stations of manufacturing system 102 can include sensors configured to generate and/or collect sensor data associated with process tools 104, process procedures 106, and/or process controllers 108. Sensor data can include a value of one or more of temperature (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, such as settings or components (e.g., size, type, etc.) of the manufacturing system 102, or process parameters of the manufacturing system 102. The sensor data can be provided while the manufacturing system 102 is performing a substrate process. The sensor data can be different for each substrate.

As shown in FIG. 1, metrology system 110 includes metrology tools 114 and data preparation tool 116. Metrology tools 114 can include a variety of sensors to measure process results (e.g., critical dimension, thickness, uniformity, etc.) and detect parameters within the manufacturing system 102. For example, wafers processed within one or more processing chamber can be used to measure critical dimensions. Metrology tools 114 may also include devices to measure process results of substrates processed using the manufacturing system. For example, process results such as critical dimensions, thickness measurements (e.g., film layers from etches, depositing, etc.) can be evaluated of substrates processed according to process recipe and/or actions performed by process controllers 108. Those measurements can also be used to measure conditions of a chamber over a recovery process such as after a seasoning procedure that includes processing a series of wafers (e.g., blank wafers) or subsequent to an update of processing chamber control knobs.

Data preparation tool 116 may include process methodology to extract features and/or generate synthetic/engineered data associated with data measured by metrology tools 114. In some embodiments, data preparation tool 116 can identify correlations, patterns, and/or abnormalities of metrology and/or process performance data. For example, data preparation tool 116 may perform a feature extraction where data preparation tool 116 uses combinations of measured data to determine whether a criterion is satisfied. For example, data preparation tool 116 can analyze multiple data points of an associated parameter (e.g., thickness, critical dimension, defectivity, plasma conditions, etc.) to determine whether rapid changes occurred during an iteration of a seasoning procedure within a processing chamber. In some embodiments, data preparation tool 116 performs a normalization across the various sensor data associated with various process chamber conditions. A normalization may include processing the incoming sensor data to appear similar across the various chambers and sensors used to acquire the data.

In some embodiments, data preparation tool 116 can perform one or more of a process control analysis, univariate limit violation analysis, or a multivariate limit violation analysis on metrology data (e.g., obtained by metrology tools 114). For example, data preparation tool 116 can perform statistical process control (SPC) by employing statistics based methodology to monitor and control process controllers 108. For example, SPC can promote efficiency and accuracy of a preventive maintenance and/or processing chamber control knob tuning (e.g., by identifying data points that fall within and/or outside control limits).

In some embodiments, a processing chamber can be measured throughout a seasoning procedure. In some embodiments, increased amounts of metrology data is taken during predetermined seasoning procedures. For example, during or immediately after a wafer is processed, additional sensors can be activated and/or currently activated sensor may take additional data. In some embodiments, process controllers 108 may trigger measurement by metrology tools 114 based on operations to be performed by process tools 104. For example, process controllers 108 can trigger activation of one or more process results (e.g. of metrology tools 114) responsive to an update of one or more processing chamber control knobs subsequent to a chamber recovery procedure.

In some embodiments, the extracted features, generated synthetic/engineered data, and statistical analysis can be used in association with machine learning system 170 (e.g., to train, validate, and/or test machine learning model 190). Additionally and/or alternatively, data preparation tool 116 can output data to server 120 to be used by any of endpoint detection tool 124 and/or chamber knob tool 126.

Data store 140 may be a memory (e.g., random access memory), a drive (e.g., a hard drive, a flash drive), a database system, or another type of component or device capable of storing data. Data store 140 may be in-situ (e.g., a local computer) or may be remote (e.g., a cloud-based system). Data store 140 may store one or more historical data 142 including old sensor data 144, and/or old control knob data 146 of prior chamber conditions and process results of substrates processed in the associated chamber conditions. Old sensor data 144 may be sensor data associated with and/or collected during a previous execution (e.g., a previous run) of a process procedure. Old control knob data 146 may be control knob data associated with a previous execution of a process procedure and/or associated with a previous seasoning operation of the processing chamber. In some embodiments, the historical data 142 may be used to train, validate, and/or test a machine learning model 190 of machine learning system 170 (see e.g., FIG. 7 for exemplary methodology). In some embodiments, data store 140 stores endpoint detection data 148. The endpoint detection data 148 may be indicative of one or more endpoint detection set points for chamber control knob tuning.

Server 120 may include one or more computing devices such as a rackmount server, a router computer, a server computer, a personal computer, a mainframe computer, a laptop computer, a tablet computer, a desktop computer, etc. The server 120 can include an endpoint detection tool 124, and a chamber knob tool 126. Server 120 may include a cloud server or a server capable of performing one or more cloud-based functions. For example, one or more operation of endpoint detection tool 124 or chamber knob tool 126 may be provided to a remote device (e.g., server 120) using a cloud environment.

The chamber knob tool 126 may receive data from process tools 104 (e.g., sensor data, etc.) and/or from data preparation tool 116 (e.g., metrology data, etc.) and generate a chamber control knob update associated with a preventive maintenance and/or a chamber recovery procedure (e.g., seasoning procedure). The chamber knob tool 126 may generate chamber control knob update data (e.g., updates to one or more control knobs (e.g., process parameters)). In some embodiments, the chamber knob tool 126 receives chamber data (e.g., raw sensor data, processed sensor data) from process tools 104, and/or processed data output from data preparation tool 116. The chamber knob tool 126 may generate chamber control knob update data based on chamber data received from process tools 104 and/or processed data output from data preparation tool 116. In some embodiments, the data preparation tool 116 receives raw sensor data from metrology tool 114. The raw sensor data may be combined with synthetic data engineered from data preparation tool 116. The chamber knob tool 126 may determine an update to the chamber control knobs (e.g., one or more chamber process parameters) which updates the chamber conditions to produce substrates having process results meeting a threshold condition. For example, the chamber knob tool may identify a change in chamber control knobs such that a substrate processed under the chamber conditions results in the substrate having process results meeting threshold conditions associated with one or more process procedures 106. The chamber control knobs may be associated with a process procedure 106. The updates to process procedures may alter a manner in which a process procedure 106 is implemented by process tools 104. For example, an update may include increasing or decreasing a process time of one or more process operations of a process procedure 106. In some embodiments, the chamber knob tool 126 may use a machine learning model that receives input data such as chamber data from process tools 104, and/or processed data output from data preparation tool 116, and outputs chamber control knob updates to transition the processing chamber to a production mode of operation. As will be discussed later, the machine learning model may include a bootstrap aggregation model, a random forest tree decision tree model, a partial least squares regression (PLS) model, a least absolute shrinkage and selection operator (LASSO) regression model, and/or Ridge regression model among other models. The machine learning model may include ensemble modeling comprising multiple models (e.g., stacked modeling) and leveraging higher confidence models for final classification of the received data.

The endpoint detection tool 124 receives output data (e.g., chamber control knob update data) from chamber knob tool 126 and determines a characteristic (e.g., measurable/observable feature) of the processing chamber that serves as an end condition for a substrate process or individual process steps (e.g., carrying out multiple steps of a substrate process recipe). The endpoint detection tool 124 can determine an end condition (e.g., measurable/observable feature or characteristic of a chamber indicating an end to a process or process step) based on received chamber control knob update data. For example, data output by the chamber knob tool 126 may include a process parameter indicating an ending time such as a process duration (e.g. sometime referred to as trim time, event time, process time, etc.) associated with a chamber control knob tuning process. In some embodiments, the endpoint detection tool 124 and the chamber knob tool 126 may process received data to determine an ending point (sometimes referred to an end point detection set point (EPD SP)) for a process procedure operation (e.g., process procedure step). The ending point may be an ending time, an ending temperature, an ending pressure, or some other ending parameter associated with the process procedure. For example, an end condition may be associated with optical data such as reflectivity spectra from reflecting light on a surface of a substrate being process or previously processed. In some embodiments, the endpoint detection tool 124 includes a machine learning model that uses control knob data (e.g., chamber control knob update data (e.g., by chamber knob tool 126)), synthetic and/or engineered data (e.g., from data preparation tool 116), and/or general process parameter values corresponding to process procedures 106, to determine an end point to a process procedure operation. For example, endpoint detection tool may determine an end point for a chamber control knob tuning procedure.

In some embodiments, the chamber knob tool 126 and/or endpoint detection tool 124 may perform the functionality described herein to prepare process parameters (e.g., control knobs) for a production operational mode. For example, the control knob updates and the associated end point conditions of the chamber control knob tuning procedure may correspond with the process parameters, when used to process a substrate in a processing chamber of corresponding condition, results in the substrate having process results that meets target conditions (e.g., process uniformity, critical dimensions, etc.).

As previously described, some embodiments of the endpoint detection tool 124, and/or chamber knob tool 126 may perform their described methodology using a machine learning model. The associated machine learning models may be generated (e.g., trained, validated, and/or tested) using machine learning system 170. The following exemplary description of machine learning system 170 will be described in the context using machine learning system 170 to generate a machine learning model 190 associated with chamber knob tool 126. However, it should be noted that this description is purely exemplary. Analogous processing hierarchy and methodology can be used in the generation and execution of machine learning models associated with the endpoint detection tool 124, and/or chamber knob tool 126 individually and/or in combination with each other, as will be discussed further in association with other embodiments.

The machine learning system 170 may include one or more computing devices such as a rackmount server, a router computer, a server computer, a personal computer, a mainframe computer, a laptop computer, a tablet computer, a desktop computer, a cloud computer, cloud-based server, a system stored on one or more clouds, etc. The machine learning system 170 may include a chamber knob component 194. In some embodiments, the chamber knob component 194 may use historical data 142 to determine a chamber control knob update (e.g. an update to one or more process parameters of a process procedure (e.g., process procedure 106) to ready the chamber for production using the chamber control knob update (e.g., the updated one or more process parameters). The chamber may be ready for production when a process procedure carried out according to the updated process parameters results in a substrate having one or more process results that meets (e.g., approximately and/or substantially meets) one or more target conditions (e.g., thickness, critical dimension, sidewall angle, etc.). In some embodiments, the chamber knob component 194 may use a trained machine learning model 190 to determine the chamber control knob update. The trained machine learning model 190 may use historical data to determine the chamber control knob update.

In some embodiments, the trained machine learning model 190 is stored on server machine 192 and/or server 120. Server machine 180 and/or server machine 192 may store one or more machine learning models recently trained (e.g., to perform model performance management). For example, one or more models trained within a duration of time (e.g., last 6 months) may be stored in server machine 192 and one or more final models for predicting chamber conditions may be stored on server 120 (e.g., operable with chamber knob tool 126).

In some embodiments, the machine learning system 170 further includes server machine 172 and server machine 180. The server machine 172 and 180 may be one or more computing devices (such as a rackmount server, a router computer, a server computer, a personal computer, a mainframe computer, a laptop computer, a tablet computer, a desktop computer, a cloud-based computing system, etc.), data stores (e.g., hard disks, memories databases), networks, software components, or hardware components.

Server machine 172 may include a data set generator 174 that is capable of generating data sets (e.g., a set of data inputs and a set of target outputs) to train, validate, or test a machine learning model. The data set generator 174 may partition the historical data 142 into a training set (e.g., sixty percent of the historical data, or any other portion of the historical data), a validating set (e.g., twenty percent of the historical data, or some other portion of the historical data), and a testing set (e.g., twenty percent of the historical data). In some embodiments, the chamber knob component 194 generates multiple sets of training data. For example, one or more sets of training data may include each of the data sets (e.g., a training set, a validation set, and a testing set).

Server machine 180 includes a training engine 182, a validation engine 184, and a testing engine 186. The training engine 182 may be capable of training a machine learning model 190 using one or more old sensor data 144 and old control knob data 146 of the historical data 142 (of the data store 140). In some embodiments, the machine learning model 190 may be trained using one or more outputs of the data preparation tool 116, the endpoint detection tool 124, and/or the chamber knob tool 126. For example, the machine learning model 190 may be a hybrid machine learning model using sensor data and/or mechanistic features such as a feature extraction, mechanistic modeling and/or statistical modeling. The training engine 182 may generate multiple trained machine learning models 190, where each trained machine learning model 190 corresponds to a distinct set of features of each training set.

The validation engine 184 may determine an accuracy of each of the trained machine learning models 190 based on a corresponding set of features of each training set. The validation engine 184 may discard trained machine learning models 190 that have an accuracy that does not meet a threshold accuracy. The testing engine 186 may determine a trained machine learning model 190 that has the highest accuracy of all of the trained machine learning models based on the testing (and, optionally, validation) sets.

In some embodiments, the training data is provided to train the machine learning model 190 such the trained machine learning model may receive a new input having new sensor data indicative of a new state of a new processing chamber. The new output may indicate a chamber knob update such that a new substrate processed by the new processing chamber in the new state according to the first substrate processing procedure using the chamber knob update results in the new substrate having a new process result that meets the threshold condition.

The machine learning model 190 may refer to the model that is created by the training engine 182 using a training set that includes data inputs and corresponding target output (historical results of processing chamber under parameters associated with the target inputs). Patterns in the data sets can be found that map the data input to the target output (e.g. identifying connections between portions of the sensor data and resulting chamber control knob updates), and the machine learning model 190 is provided mappings that captures these patterns. The machine learning model 190 may use one or more of logistic regression, syntax analysis, decision tree, or support vector machine (SVM). The machine learning may be composed of a single level of linear of non-linear operations (e.g., SVM) and/or may be a neural network.

Chamber knob component 194 may provide current data (e.g., current sensor data associated with a state of a processing chamber during a seasoning procedure) as input to trained machine learning model 190 and may run trained machine learning model 190 on the input to obtain one or more outputs including a set of values indicating an update to one or more chamber control knobs to meet a threshold condition. In some embodiments, the threshold condition indicates that a process procedure (e.g., process procedure 106) carried out using the update to one or more chamber control knobs will result in a substrate having one or more process results that meets (e.g., approximately and/or substantially meets) one or more target conditions (e.g., thickness, critical dimension, sidewall angle, etc.). Chamber knob component 194 may be capable of identifying confidence data from the output that indicates a level of confidence that after a chamber control knob update, the process parameters updated according to the chamber control knob update meet a threshold condition to move to a production mode. In one non-limiting example, the level of confidence is a real number between 0 and 1 inclusive, where 0 indicates no confidence of the one or more chamber statuses and 1 represents absolute confidence in the chamber status.

For purpose of illustration, rather than limitation, aspects of the disclosure describe the training of a machine learning model and use of a trained learning model using information pertaining to historical data 142. In other implementation, a heuristic model or rule-based model is used to determine a control knob update.

In some embodiments, the functions of client devices 150, server 120, data store 140, and machine learning system 170 may be provided by a fewer number of machines than shown in FIG. 1. For example, in some embodiments, server machines 172 and 180 may be integrated into a single machine, while in some other embodiments, server machine 172, 180, and 192 may be integrated into a single machine.

In some embodiments, the machine learning system 170 may be fully or partially provided by server 120.

In general, functions described in one embodiment as being performed by client device 150, data store 140, metrology system 110, manufacturing system 102, and machine learning system 170 can also be performed on server 120 in other embodiments, if appropriate. In addition, the functionality attributed to a particular component can be performed by different or multiple components operating together.

In embodiments, a "user" may be represented as a single individual. However, other embodiments of the disclosure encompass a "user" being an entity controlled by multiple users and/or an automated source. For example, a set of individual users federated as a group of administrators may be considered a "user."

Figure 2A:
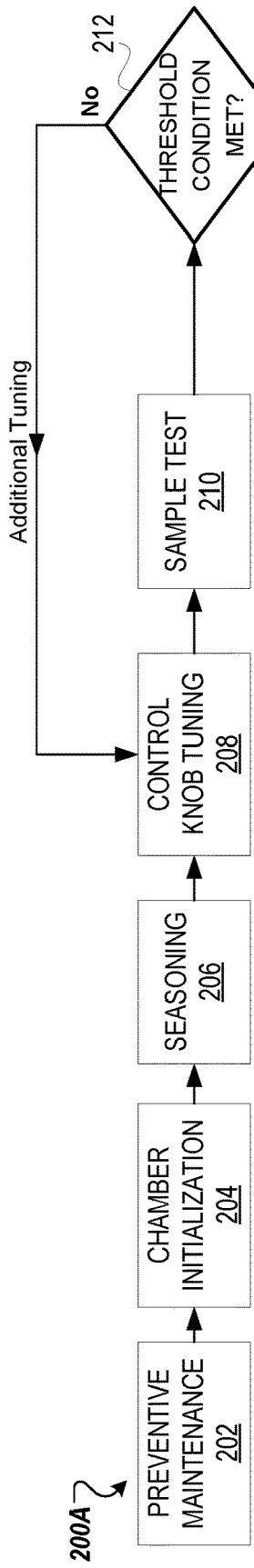
FIGS. 2A-B are block diagrams illustrating processes for performing control knob tuning in which implementations of the present disclosure may operate.
Figure 2B:
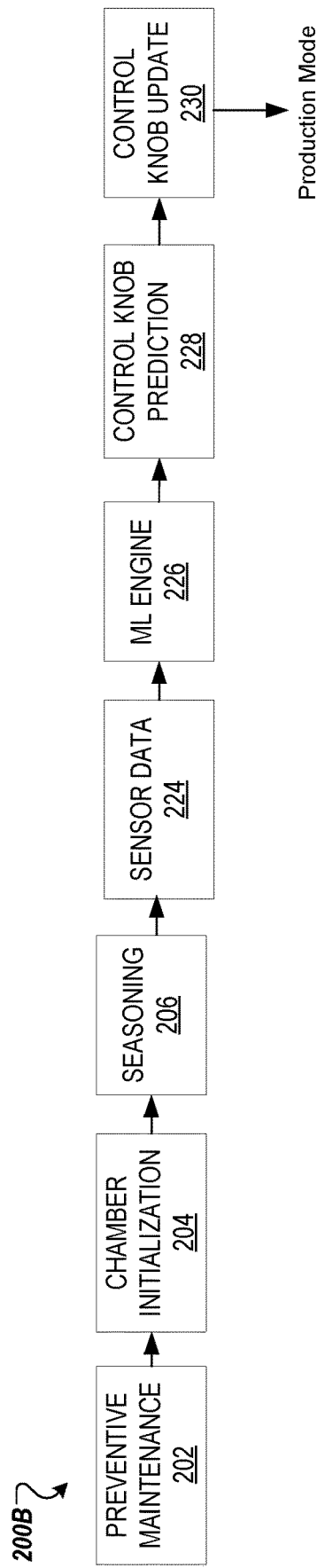

FIGS. 2A-B are block diagrams illustrating processes 200A-B for performing control knob tuning in which implementations of the present disclosure may operate.

Referring to FIG. 2A, the chamber recovery process 200A may include performing preventive maintenance 202 on one or more processing tools. Preventive maintenance 202 may include any number of processes performed on one or more processing tools (e.g., processing chambers) to maintain conditions of the processing chamber over time. In some embodiments, preventive maintenance 202 may employ proactive preventive maintenance procedures with one or more of the following aims: minimize downtime of the processing equipment, keep maintenance costs lower (e.g., maintain minor repairs than prevent larger less frequent repairs), extend life of the processing equipment, improve production quality (e.g., process results of substrates), improve processing efficiency (e.g., keep tool in production mode longer and reduce down time of processing equipment), and/or preserve safety and integrity of equipment, among other things.

In some embodiments, preventive maintenance 202 includes cleaning (e.g., wet clean maintenance) one or more processing chambers (e.g., removing build-up on chamber walls resulting from processing procedures performed within the processing chamber). The preventive maintenance 202 may restore a condition of one or more processing tools into an unseasoned state (e.g., a clean chamber that is has not yet undergone a seasoning process). Replacement and/or cleaning of one or more processing tools may result in the processing tool operating in a clean (e.g., raw) state that is further refined by using the processing tool to perform substrate processing procedures. For example, a processing chamber may be returned to an unseasoned state such as a new or clean state after the preventive maintenance 202 is performed.

As shown in FIG. 2A, chamber recovery process 200A includes chamber initialization 204. Chamber initialization 204 may include warming up the chamber or activating one or more systems associated with the processing chamber. For example, chamber initialization 204 may be performed to prepare a processing chamber to receive and process substrates. The chamber initialization may be associated with one or more process procedures (e.g., process procedures 106 of FIG. 1) that may include one or more process parameters (e.g., temperature, pressure, vacuum conditions, etc.).

As shown in FIG. 2A, chamber recovery process 200A includes seasoning 206 of a processing chamber. Chamber seasoning 206 is a procedure that includes processing a series of substrates (e.g., blank silicon wafers) to restore a chamber condition that is suitable for production (e.g., mass substrate processing). For example, in some embodiments, after chamber seasoning, a thin layer of silicon oxide covers the chamber wall.

In some embodiments, chamber recovery process 200A includes control knob tuning 208. Control knob tuning 208 is a procedure of tuning (e.g., updating, and/or adjusting) one or more chamber control knobs, where a process procedure executed according to the tuned (e.g., updated, and/or adjusted) control knobs results in a processed substrate meeting a threshold condition, as explained below in reference to sample test 210 and block 212. In some embodiments, the threshold condition may be associated with a critical dimension of the substrate (e.g., critical thickness, etc.). Chamber recovery process 200A leverages a sample test 210 to determine whether chamber control knob settings (e.g., process parameters reflecting the updated control knobs) meet the threshold condition.

In some embodiments, as shown in FIG. 2A, after control knob tuning 208 is performed, a sample test 210 is performed and evaluated. A test sample may include processing a substrate by the processing chamber under post seasoning conditions of a first quantity of substrates, and/or subsequent to a tuning of one or more chamber control knobs. The sample is measured and various process result criteria are evaluated on the sample test. For example, a sample test 210 may be evaluated to determine whether the substrate includes a processing results meeting threshold criteria such as critical dimensions, process uniformity thresholds, thickness profile requirements, etc. Processing and evaluating the sample test may involve a duration of down time to process the substrate and evaluate the processed substrate (e.g., measure process results such as thickness, and uniformity condition across a surface of the substrate). In some embodiments, control knob tuning 208 can use one or more machine learning models, one or more outputs of which can be used to tune the one or more chamber control knobs, as discussed in reference to FIG. 2B.

At block 212, chamber recovery process 200A may determine whether one or more threshold conditions of a substrate are met based on the sample test 210. A sample test 210 indicating that one or more threshold conditions of a substrate are met may be indicative of correct (e.g., substantially correct) chamber knob tuning. Threshold conditions may include criteria associated with one or more process results of the sample test 210. As previously indicated, a sample test 210 may be evaluated to determine whether the substrate includes a processing result meeting threshold criteria such as critical dimensions, process uniformity thresholds, thickness profile requirements, etc. any of which may be evaluation criteria to determine whether a chamber and/or associated process parameters meets the condition to transition to a production mode of operation. Processing logic may determine that a process results of a test sample processed in the chamber using first control knob settings does not meet the threshold condition(s) and may further perform additional control knob tuning 208 and another sample test 210 to determine whether the chamber control knobs are properly tuned (e.g., to meet the threshold condition). The process of control knob tuning 208, performing a sample test 210, and evaluating whether threshold conditions (e.g., block 212) are met based on the previous sample test can be repeated until the associated process parameters meet the threshold condition. Additional chamber knob tuning may be performed to produce a substrate which meets the threshold condition. Upon determining the threshold condition is met, the chamber recovery process 200A may proceed with final tuning 214. Final tuning 214 may include a final tuning of one or more chamber control knobs before initiating a production mode of the processing chamber.

Referring to FIG. 2B, a process 200B for performing control knob tuning is shown, according to aspects of the present disclosure. Process 200B may include preventative maintenance 202, chamber initialization 204, and seasoning 206 as outlined previously. In some embodiments, process 200B uses one or more machine learning models to tune the chamber control knobs. Sensor data 224 is input to a machine learning engine (e.g., ML engine 226). Sensor data 224 may be indicative of a state of a processing chamber subsequent to a chamber recovery procedure (e.g., seasoning 206). In some embodiments, sensor data 224 is received from one or more sensors of the processing chamber. The one or more sensor may include an OES sensor and/or a reflectometry spectra sensor. In some embodiments, sensor data can include a value of one or more of temperature (e.g., heater temperature), spacing (SP), pressure, high frequency radio frequency (HFRF), voltage of electrostatic chuck (ESC), electrical current, flow, power, voltage, etc. Sensor data can be associated with or indicative of manufacturing parameters such as hardware parameters, for example, settings or components (e.g., size, type, etc.) of the processing chamber, or process parameters (e.g., control knobs) of the manufacturing equipment. The sensor data can be provided while the processing chamber is performing a substrate process. The sensor data can be different for each substrate processed.

In some embodiments, ML engine 226 includes machine learning system 170 of FIG. 1. ML engine 226 may train a machine learning model (e.g., model 190 of FIG. 1) based on sensor data 224. Training, validating, and testing the machine learning model is discussed in detail in reference to FIGS. 6 and 7.

A control knob prediction 228 may be determined based on one or more outputs of ML engine 226. In some embodiments, an output of ML engine 226 is used to generate one or more predictions for one or more chamber control knob settings. The control knob prediction 228 may be associated with tuning one or more chamber control knobs (e.g., control knob tuning 208). In some embodiments, the control knob prediction 228 is determine in view of a substrate processing meeting threshold conditions (e.g., the threshold condition as discussed in reference to block 212).

The control knob prediction 228 may be used to update the one or more chamber control knobs (e.g., control knob update 230). In some embodiments, subsequent to updating the one or more control knobs according to control knob update 230, the processing chamber may produce a substrate according to a process procedure and the chamber control knob update that satisfies the threshold condition. According to meeting the threshold condition, the processing chamber may be in a state associated with a process procedure, that, when carried out according to the control knob update 230, will result in a substrate having one or more process results that meets one or more target conditions (e.g., thickness, critical dimension, etc.). In some embodiments, subsequent to control knob update 230, a production mode of the processing chamber may be initiated.

In some embodiments, process 200B employs less time (e.g., less down time of a processing chamber) to return a chamber to a production mode. For example, chamber recovery process 200B may not necessitate performance of a sample test (e.g., processing and evaluation of a test wafer) to reach a determination that a processing chamber can produce a substrate according to a process procedure using the chamber control knob update such that the substrate meets one or more threshold conditions. In another example, process 200B may determine a chamber control knob update (e.g., control knob update 230) that may immediately allow for the initiation of a production mode of the processing chamber, rather than performing additional tuning or final tuning of the chamber control knobs to meet the one or more threshold conditions.

As will be discussed further in other embodiments, chamber recovery process 200A may be leveraged to generate training data for ML engine 226. Sensor data of a processing chamber may be tracked over a seasoning process 206 and data associated with sample test 210 may be leveraged to validate output from ML engine 226. For example, output from ML engine 226 may be used to determine a chamber control knob update. An evaluation of a sample test processed according to the same process procedure and control knob update can be compared against the prediction by the ML engine 226 to validate and further refine the ML engine 226.

Figure 3:
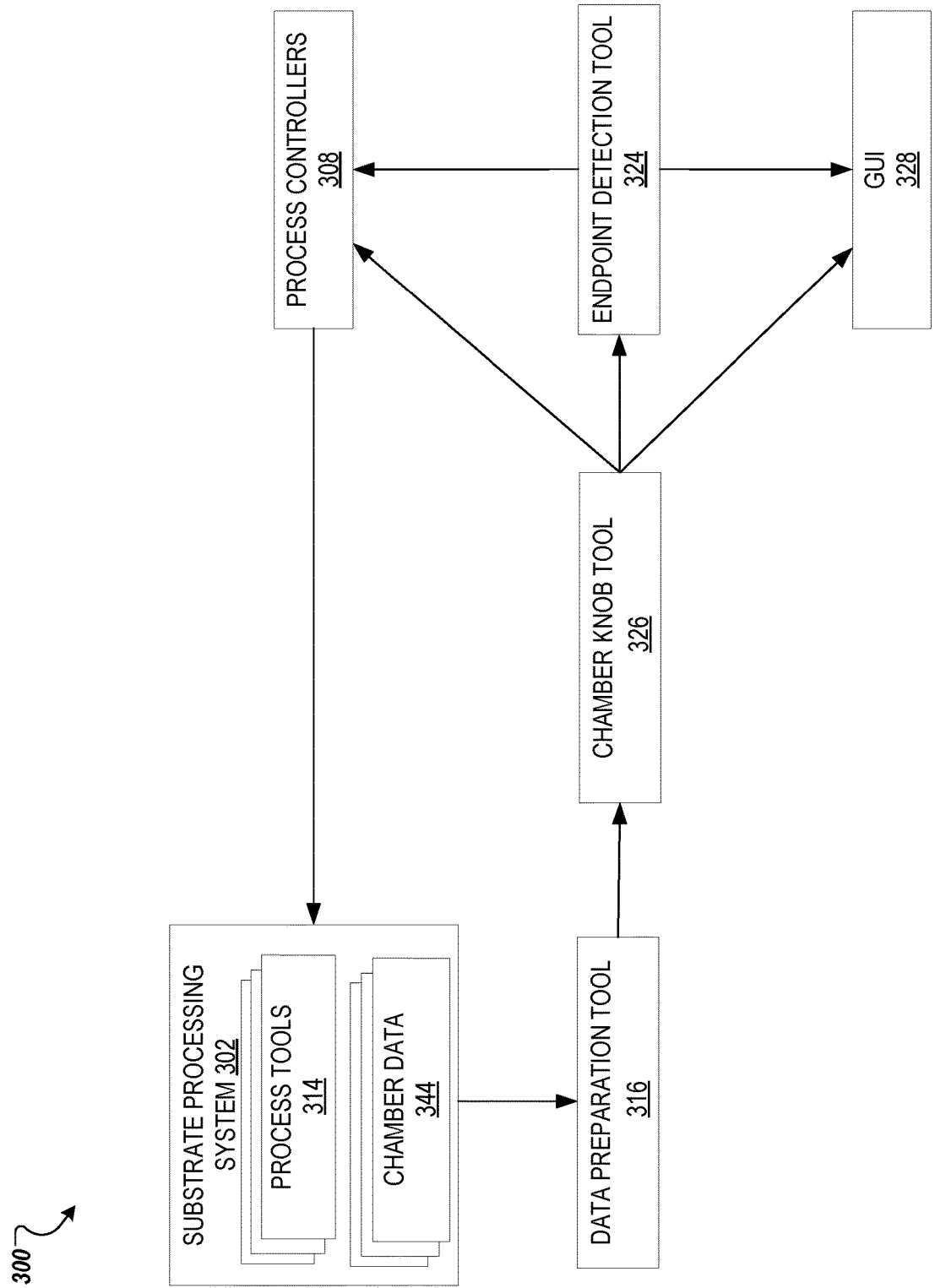
FIG. 3 is a block diagram illustrating a chamber monitoring and maintenance system in which implementations of the disclosure may operate.

FIG. 3 is a block diagram illustrating a chamber monitoring and maintenance system 300 in which implementations of the disclosure may operate. The chamber monitoring and maintenance system 300 includes a substrate processing system 302 (e.g., manufacturing system 102 of FIG. 1). The substrate processing system 302 can include process tools 314 and chamber data 344 (e.g., acquired using process tools 314). The process tools 314 can include chamber sensors (e.g., to measure radio frequency (RF), temperature, gas, pressure, etc.) and additional sensors (e.g., optical emission spectroscopy (OES) sensor, reflectometry spectra sensor, etc.). The chamber data 344 can include data indicative of a state of a processing chamber. For example, process tools 314 can measure and monitor parameters such as RF, temperature, gas, spectroscopy data, etc.

In some embodiments, the chamber data 344 is processed by data preparation tool 316. The data preparation tool 316 can receive chamber data (e.g., raw sensor data) and generate synthetic data associated with various combinations, correlations, and/or artificial parameters. The data preparation tool 316 can reduce dimensionality of the raw sensor data using groups or features. For example, the data preparation tool 316 may generate features that include the rate of change of a parameter value and/or a collection of parameters value. In some embodiments, data preparation tool 316 performs any of partial least squares analysis, principal component analysis, independent component analysis, multifactor dimensionality reduction, nonlinear dimensionality reduction, and/or any combination thereof. In some embodiments, the data preparation tool 316 is designed for edge detection of the chamber data. For example, the data preparation tool 316 includes methodology that aims at identifying data points that change sharply and/or that have discontinuities. For example, the slope of one or more measured chamber parameters of a processing chamber.

In some embodiments, data preparation tool 316 performs a normalization across the various sensor data associated with various process chamber conditions. A normalization may include processing the incoming sensor data to appear similar across the various chambers and/or sensors used to acquire the data. In some embodiments, data preparation tool 316 may include aspects and/or features of data preparation tool 116 of FIG. 1.

In some embodiments, the data preparation tool 316 is used to generate input for chamber knob tool 326. As discussed further in other embodiments, the chamber knob tool 326 receives input data (e.g., raw sensor data, synthetic data, output of other models, etc.) to determine a chamber control knob update (e.g., an update to one or more process parameters associated with a processing chamber). For example, the chamber control knob update may include instruction such as increase/decrease temperature, increase/decrease process time, and the like. In some embodiments, the chamber knob tool 326 receives sensor data and metrology data indicative of a state of a processing chamber subsequent processing a series of substrates (e.g., seasoning wafers). The chamber knob tool 326 may output a set of values indicative of a chamber control knob update that meets a threshold condition (e.g., that a substrate processed according to a process procedure incorporating the chamber control knob update will meet a target outcome). For example, the chamber knob tool 326 may output data indicative of a chamber control knob update associated with a substrate process procedure. The chamber control knob update may indicate an update to the associated process procedure that when an associated substrate is processed subsequent to the chamber control knob update, the processing of the substrate would result in the substrate having a process result meeting one or more threshold conditions associated with a substrate processing procedure (e.g., a substrate process recipe). In some embodiments, as will be discussed further in other embodiments, the chamber knob tool 326 may incorporate a machine learning model (e.g., trained using FIG. 7 and/or implemented using FIG. 6).

In some embodiments, the chamber knob tool 326 outputs data (e.g., chamber control knob update data) to endpoint detection tool 324 (e.g., endpoint detection tool 124 of FIG. 1). The endpoint detection tool 324 may process the data output by the chamber knob tool 326 to determine an associated end condition (e.g., a measurable/observable feature) of the processing chamber associated with the chamber control knob update. In some embodiments, endpoint detection tool 324 determines an endpoint of a process procedure operation (e.g., a step of a process procedure) based on data received from chamber knob tool 326. The endpoint may be an end time (e.g., duration), an end temperature, an end pressure, or some other end parameter associated with the process procedure. For example, data received from chamber knob tool 326 may indicate an updated process duration associated with a process procedure. The endpoint detection tool 324 may determine endpoint criteria such as an optical spectra measurement that correlates to the process duration. In some embodiments, endpoint detection tool 324 determines a correlation between a substrate result (e.g., a substrate thickness, a substrate dimension, a substrate optical quality, etc.) and the end point. The correlation may be deterministic (e.g., one input results in one output). In some embodiments, endpoint detection tool 324 uses a machine learning model to determine an end point to a process procedure operation.

In some embodiments, the chamber knob tool 326 outputs instructions to process controllers 308 to alter one or more operations associated with the substrate processing system 302. For example, the chamber knob tool 326 may indicate a chamber control knob update and process controller may alter the operating parameters of the substrate processing system to enter a production mode of operation based on the control knob update. In another example, the chamber knob tool 326 may indicate an update to one or more process parameters. In another example, the chamber knob tool 326 may indicate to the process controllers 308, that the chamber control knob tuning is insufficient (e.g., fails to meet a threshold condition) and instruct the process controller 308 to carry out further chamber control knob tuning on the substrate processing system 302.

In some embodiments, the endpoint detection tool 324 outputs instructions to process controllers 308 to alter one or more operations associated with the substrate processing system 302. For example, the endpoint detection tool 324 may indicate to the process controllers 308, that the chamber control knob tuning is insufficient (e.g., that a substrate processed according to a chamber control knob update will not result in the substrate meeting one or more target conditions) and instruct the process controller 308 to carry out further chamber control knob tuning on the substrate processing system 302. In another example, the endpoint detection tool 324 may indicate to the process controller 308 that the chamber control knob tuning is sufficient (e.g., that a substrate processed according to a chamber control knob update will result in the substrate meeting one or more target conditions), and that a production mode of the substrate processing system is to be initialized. The endpoint detection tool 324 may update an endpoint condition based on the updated chamber control knob tuning. For example, the endpoint detection tool 324 may update an endpoint condition based on feature-based data of a substrate processed according to a process procedure and the updated chamber control knob tuning, such as optical data, detectable thickness of the substrate, plasma flux through the processing chamber, etc.

As shown in FIG. 3, the process controllers 308 receive input from the chamber knob tool 326 and the endpoint detection tool 324, and provide instructions to the substrate processing system 302 in carrying out further operations. For example, process controllers 308 may instruct the substrate processing system 302 to execute a process recipe according to a chamber control knob update. In another example, process controllers 308 may instruct the substrate processing system 302 to update one or more process parameters according to a chamber control knob update. In another example, process controllers 308 may instruct the substrate processing system to initialize a production mode.

As shown in FIG. 3, the chamber knob tool 326 and the endpoint detection tool 324 may output instruction to be displayed on a graphical user interface (GUI). The graphical user interface may output chamber control knob predictions on a graphical user interface. The GUI may output instructions to initialize a production mode of the substrate processing system 302. In some embodiments, the chamber knob tool 326 and/or the endpoint detection tool 324 output indications associated with one or more operations to perform on a substrate processing system for display on the GUI 328. For example, GUI 328 may display a notification to update one or more chamber control knobs (e.g., process parameters associated with the substrate processing system 302). In another example, GUI 328 may display a notification to initialize a production mode of the substrate processing system 302. As another example, GUI 328 may display a notification to perform further tuning of one or more chamber control knobs.

Figure 4A:
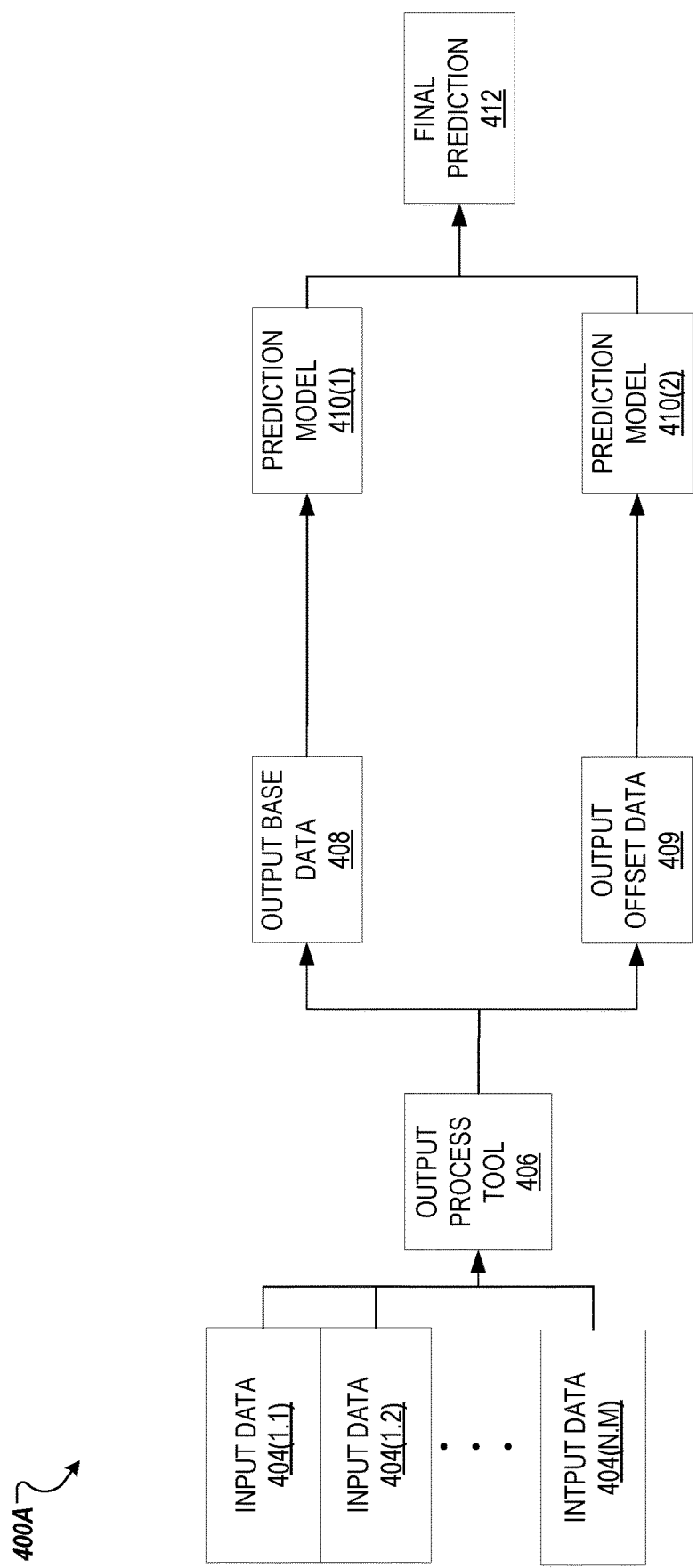
FIG. 4A depicts a block diagram illustrating exemplary modeling architecture for chamber control knob tuning, according to some embodiments.

FIG. 4A depicts a block diagram illustrating exemplary modeling architecture 400A for chamber control knob tuning, according to some embodiments. Architecture 400A may use one or more machine learning models to determine a chamber control knob prediction (e.g., an update to one or more process parameters associated with a processing chamber). In some embodiments, architecture 400A uses boosted modeling to determine a prediction.

In some embodiments, input data 404 is associated with one or more instances of performing a process recipe, sometime referred to as events. For example, a first event may be associated with a first instance of performing the process recipe Input data 404 may include multiple subsets (e.g., input data 404(1.1), input data 404(1.2), etc.). Each subset of input data may be associated with an operation of a process recipe. For example, input data 404(1.1) may be associated with a first operation of a first event. As another example, input data 404(1.2) may be associated with a second operation of the first event. As another example, input data 404(N.M) may be associated with an Mth operation of an Nth event. In some embodiments, the input data 404 corresponds to one or more processing events, and the subsets of input data 404 (e.g., input data 404(1.1), input data 404(1.2), etc.) correspond to one or more operations (e.g., trim steps) of each event. In some embodiments, input data 404 is collected after each corresponding event. For example, input data 404(1.1) through input data 404(1.M) may be collected after the Mth operation of the first event. In another example, input data 404(N.1) through input data 404(N.M) may be collected after the Mth operation of the Nth event. In some embodiments, a recipe operation is referred to as a trim step.

In some embodiments, input data 404 is sub-divided into multiple subsets corresponding to a respective operation of an associated process recipe by a data preparation tool (e.g., data preparation tool 316 of FIG. 3). A set of process parameters (e.g. chamber control knobs) is to be predicted for an operation corresponding to each subset of input data 404.

In some embodiments, input data 404 is provided as input to output process tool 406. Output process tool 406 may include logic for filtering, partitioning, processing, etc. . . . the input data 404. For example, the output process tool 406 may perform statistical analysis on input data 404. Output process tool 406 may calculate one or more statistical values (e.g., average value, median value, minimum value, maximum value, standard deviation value, etc.) for each corresponding subset of input data 404. In some embodiments, output process tool 406 outputs one or more sets of data. Output process tool 406 may provide output base data 408. Output base data 408 may indicate a base value of each of the corresponding subsets of input data 404. In some embodiments, output base data 408 indicates an average value (e.g., a mean value) for each of the corresponding subsets of input data 404. For example, output base data 408 may indicate an average value of subsets of input data 404(1.1) through input data 404(N.1) (e.g., input data 404 (1.1), input data 404(2.1), input data 404(3.1), etc.). As another example, output base data 408 may indicate an average value of subsets of input data 404(1.M) through input data 404(N.M) (e.g., input data 404(1.M), input data 404(2.M), input data 404(3.M), etc.). In some embodiments, output base data 408 is provided as input to a machine learning model. The machine learning model may be part of a boosted machine learning model algorithm which uses two or more machine learning models.

Output process tool 406 may provide output offset data 409. Output offset data 409 may indicate an offset value of each of the corresponding subsets of input data 404. In some embodiments, the offset value may be based on statistical deviation. The offset value may be a delta value (e.g., a difference). The offset value may be an error value. For example, the offset value of each of the corresponding subsets of input data 404 may be based on the standard deviation associated with each of the corresponding subsets of input data 404. In some embodiments, output offset data 409 indicates a delta value associated with each of the corresponding subsets of input data 404. The delta value associated with each of the corresponding subsets of input data may be based on a standard deviation value associated with each of the corresponding subsets of input data 404. For example, output offset data 409 may indicate a delta value associated with subsets of input data 404(1.1) through input data 404(N.1) (e.g., input data 404(1.1), input data 404(2.1), input data 404(3.1), etc.). As another example, output offset data 409 may indicate a delta value associated with subsets of input data 404(1.M) through input data 404(N.M) (e.g., input data 404(1.M), input data 404(2.M), input data 404(3.M), etc.). In some embodiments, output offset data 409 is provided as input to a machine learning model. The machine learning model may be part of a boosted machine learning model algorithm which uses two or more machine learning models.

In some embodiments, output base data 408 is provided to prediction model 410(1). Prediction model 410(1) may be a trained machine learning model. (e.g., trained and/or deployed using method 700 and 800 of FIGS. 7 and 8, respectively). Prediction model 410(1) may be a machine learning model of a boosting machine learning modeling architecture. Prediction model 410(1) may be trained to determine at least a first portion of one or more chamber control knob updates (e.g., an update to at least one of a set of process parameter values associated with performing a substrate processing procedure). In some embodiments, prediction model 410(1) predicts a base control knob update. A base control knob update may be a subset of a control knob update that makes up a majority of the whole control knob update. The base control knob update may be deficient by a delta (e.g., offset control knob update) to be described below. The base control knob update determined by prediction model 410(1) may be a first model output.

In some embodiments, output offset data 409 is provided to prediction model 410(2). Prediction model 410(2) may be a trained machine learning model. Prediction model 410(2) may be a machine learning model of a boosting machine learning modeling architecture. Prediction model 410(2) may be trained to determine at least a second portion of one or more chamber control knob updates. In some embodiments, prediction model 410(2) predicts an offset control knob update. An offset control knob update may be a subset of a control knob update that makes up a portion of the whole control knob update. The whole control knob update may include the base control knob update and the offset control knob update. Both the base control knob update and the offset control knob update may be weak learners (e.g., weak learning models) that are combined to generate a strong learner (e.g., a strong learning model; the control knob update). The offset control knob update may be a delta control knob update (e.g., a difference between a first value associated with the control knob update and a second value associated with the control knob update). The offset control knob update may compensate for an error of the base control knob update between a value of the base control knob update and the control knob update (e.g., the sum of the base and the offset control knob updates). The offset control knob update determined by prediction model 410(2) may be a second model output.

In some embodiments, the base control knob update determined by prediction model 410(1) and the offset control knob update determined by prediction model 410(2) are combined to form final prediction 412. In some embodiments, a combination of the base control knob update and the offset control knob update is more accurate (e.g., more reliable, stronger, etc.) than one or either update alone. The combination of the base control knob update and the offset control knob update may be a stronger prediction (e.g., a prediction that results in a base control knob with greater confidence that the update, when used, will results in a substrate that meets threshold conditions) than a prediction from a single model. In some embodiments, final prediction 412 is a first update to one or more chamber control knobs based on a combination of at least a first model output with the second model output. Final prediction 412 may be based on one or more outputs of prediction model 410(1) and prediction model 410(2). A substrate processing procedure may be performed based on final prediction 412. In some embodiments, performing a substrate processing procedure based on final prediction 412 by a processing chamber having an environment in a first state (e.g., after a chamber recovery process) will result in processing a substrate having a process result that meets a threshold condition (e.g., meeting a target thickness, critical dimension, quality, etc.).

Figure 4B:
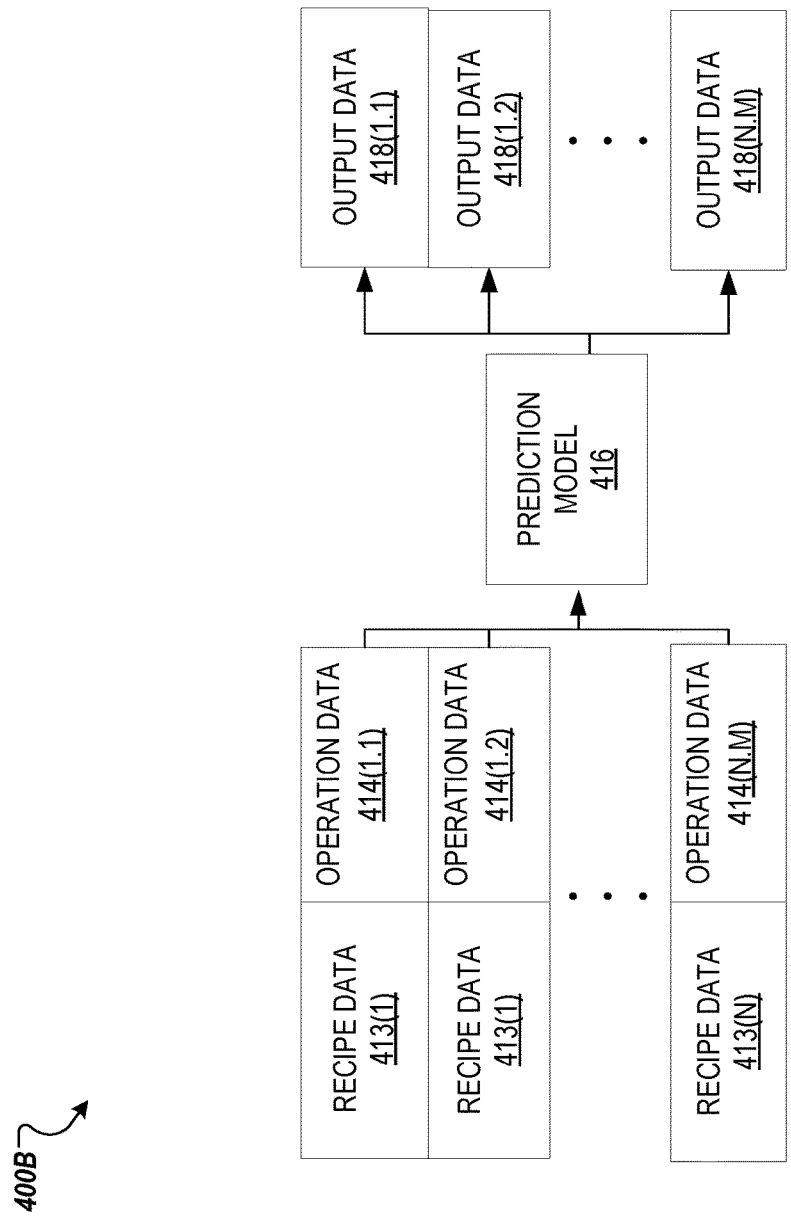
FIG. 4B depicts a block diagram illustrating exemplary data preparation architecture, according to some embodiments.

FIG. 4B depicts a block diagram illustrating exemplary data preparation architecture, according to some embodiments. Architecture 400B may use a data preparation tool 416 (e.g., data preparation tool 316 of FIG. 3) to separate one or more subsets of input data. In some embodiments, prediction model 416 receives input data associated with one or more instances of performance of a chamber process recipe. The input data may be sensor data from one or more sensors associated with a processing chamber. In some embodiments, the sensor data may be collected subsequent to each instance of performance of a chamber process recipe. For example, recipe data 413(1) may be collected after a first instance of performance of a chamber process recipe. As another example, recipe data 413(N) may be collected after an Nth instance of performance of chamber process recipe. In some embodiments, each subset of recipe data includes one or more subsets of sensor data associated with one or more operations of the chamber process recipe. Each subset of recipe data may include sensor data corresponding to each operation of the corresponding iteration of the corresponding chamber process recipe and/or chamber seasoning recipe. Operation data 414 may be sensor data corresponding to each operation of a corresponding iteration of a chamber process recipe and/or chamber seasoning recipe. Operation data 414(1.1) may correspond to a first operation (e.g., step) of a first iteration of a chamber process/seasoning recipe. Operation data 414(N.M) may correspond to an Mth operation (e.g., step) of an Nth iteration of a chamber process/seasoning recipe. Recipe data 413 may include operation data 414. For example, recipe data 413(1) may include operation data 414(1.1) through operation data 414(1.M) (e.g., operation data 414(1.1), operation data 414(1.2), operation data 414(1.3), etc.). As another example, recipe data 413(N) may include operation data 414(N.1) through operation data 414(N.M) (e.g., operation data 414(N.1), operation data 414(N.2), operation data 414(N.3), etc.). Operation data 414 may be associated with one or more recipe operation predictions of the corresponding chamber process/seasoning recipe.

In some embodiments, prediction model 416 predicts one or more process parameters associated with a chamber process recipe. Subsets of the output of prediction model 416 may correspond to subsets of recipe data 413. Output data 418 may include predictions of one or more process parameters output by prediction model 416. Subsets of output data 418 may correspond to subsets of operation data 414. For example, output data 418(1.1) may correspond to operation data 414(1.1). As another example, output data 418(N.M) may correspond to operation data 414(N.M).

Output data 418(1.1) may include a prediction of one or more process parameters associated with a recipe operation (e.g., a recipe step) corresponding to operation data 414 (1.1). Output data 418 may be input to one or more tools or machine learning models of the present disclosure.

Figure 5:
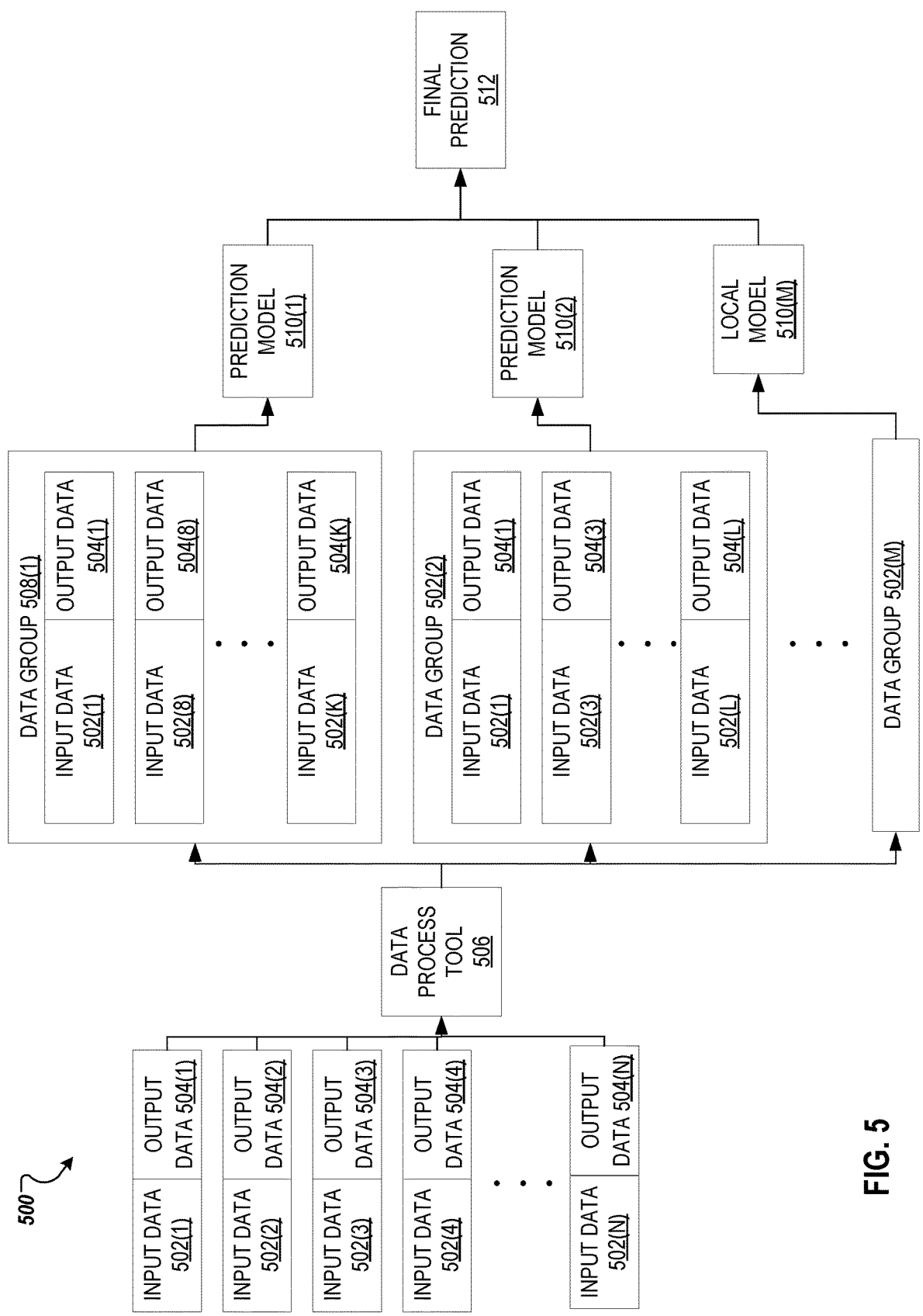
FIG. 5 illustrates a block diagram of a chamber knob prediction system using stacked modeling, according to aspects of the disclosure.

FIG. 5 illustrates a block diagram of a chamber knob prediction system 500 using stacked modeling, according to aspects of the disclosure. One or more of the models (e.g., machine learning models) described herein may incorporate model stacking as described in association with FIG. 5. For example, model 190 of machine learning system 170 (e.g., of FIG. 1) may include one or more methodologies and/or process presented in FIG. 5. As another example, prediction models 410 of FIG. 4A and 416 of FIG. 4B may include one or more methodologies and/or process presented in FIG. 5.

As shown in FIG. 5, the process result prediction system 500 may include a dataset including a set of input data 502 (e.g., one or more of input data 404 of FIG. 4A or recipe data 413 of FIG. 4B) and a set of output data 504 (e.g., output data 418 of FIG. 4B) corresponding to individual input data 502. The input data 502 and output data 504 may be received by data process tool 506. Data process tool 506 may perform partitioning of the input and output data into data groups 508. The data groups 508 may contain different combinations of input data 502 and output data 504 groupings. In some embodiments the data groups 508 are mutually exclusive, however, in other embodiments the data groups 508 include overlapping data points.

As shown in FIG. 5, the chamber knob prediction system generates a stack of local models 510. Each local model may be generated and/or trained based off an individual associated data group 508. Each local model 510 may be trained to generate an independent output from other local models 510 based on the same received input. Each local model may receive new input data and provide new output data based on the trained model. Each model (e.g., due to training dataset differences) may identify different features, artificial parameters, and/or principle components based on the differences in the data groups 508 used to train the corresponding models 510.

The local models 510(M) may be used in conjunction with one another to generate and/or train a final model. In some embodiments, the final model includes a weighted average ensemble. The weighted average ensemble weights the contribution of each local model 510 by a trust or level of confidence of the contributions (e.g., outputs) received by that corresponding model. In some embodiments, the weights are equivalent across the local models 510 (e.g., each output from each local model 510 is treated equally across the models). In some embodiments, the final model is trained to determine various weights (e.g., contribution weights) of the local models (e.g., using a neural network or deep learning network). For example, one or more types of regression (gradient boosting regression, linear regression, logistical regression, etc.) may be performed to determine one or more contribution weights associated with the local models. The final model 512 may receive as input, outputs from local models 510 as inputs and attempts to learn how to best combine the input predictions to make and improved output prediction. In some embodiments, final model 512 is configurable. Final prediction model may receive outputs from only certain local models 510 (e.g., final model 512 may be configured to receive outputs only from certain local models 510).

Figure 6:
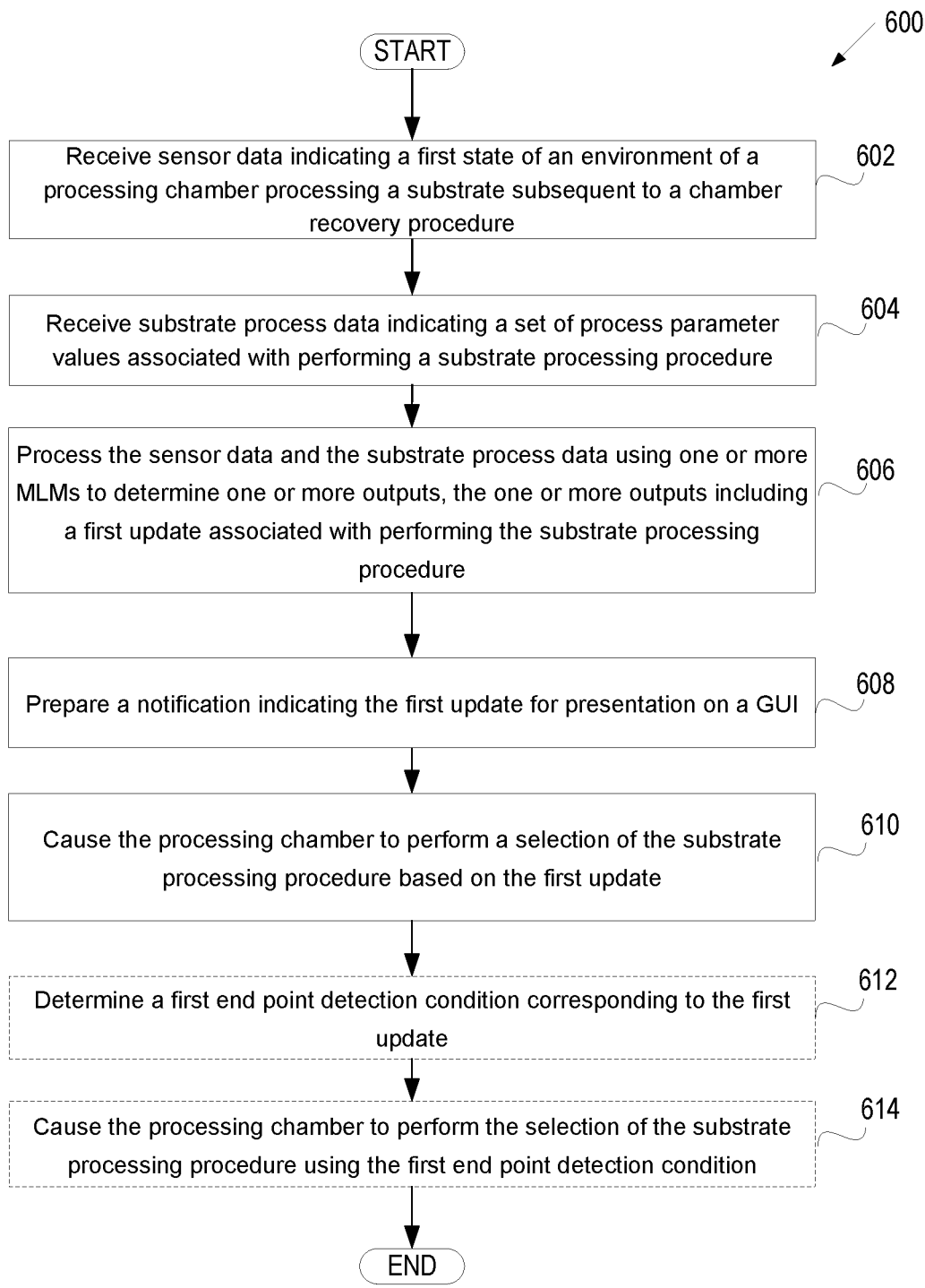
FIG. 6 depicts a flow diagram of a method for updating chamber control knobs after a chamber preventive maintenance event, in accordance with some implementations of the present disclosure.
Figure 7:
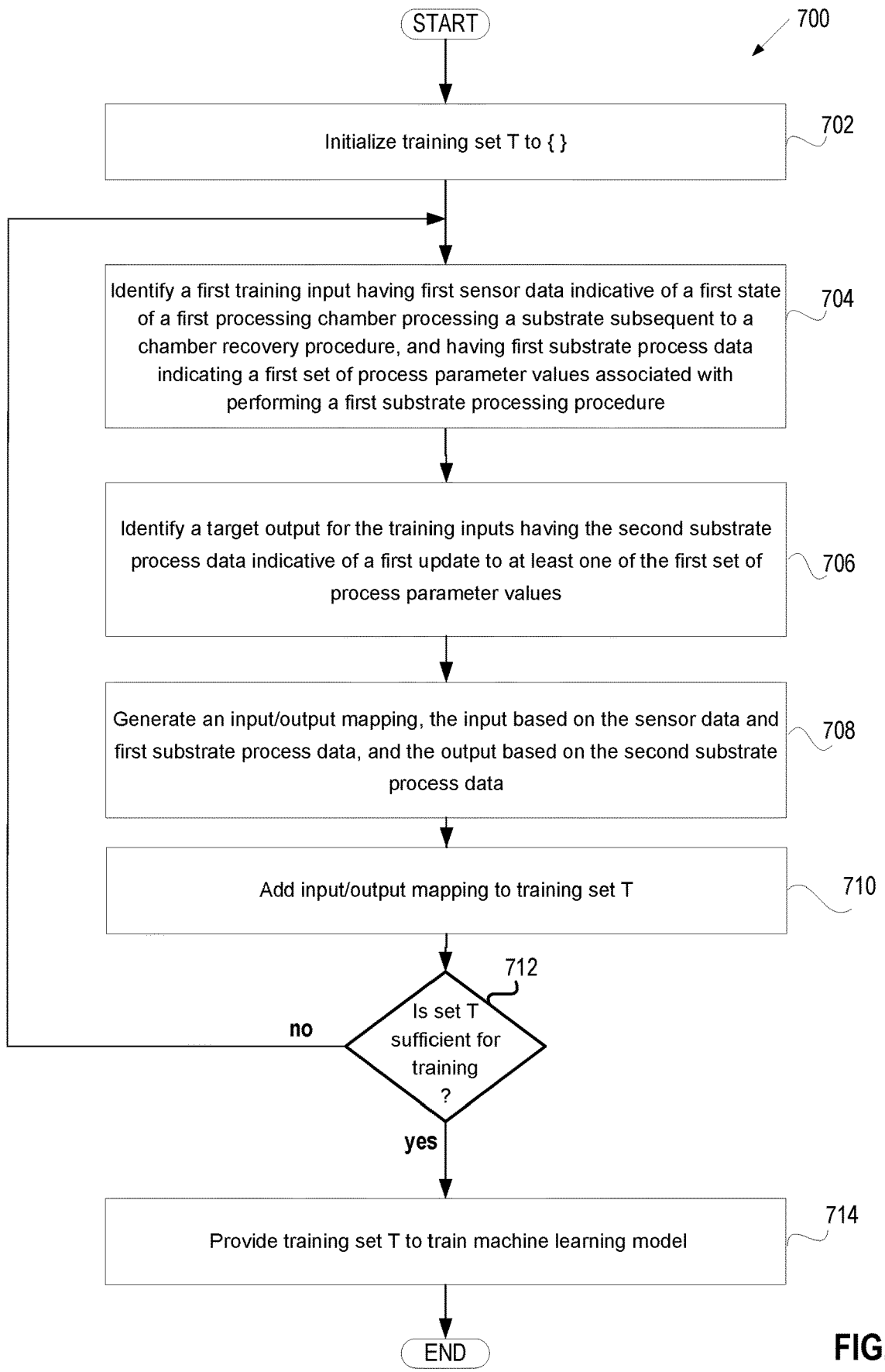
FIG. 7 is an exemplary illustration of a training phase of a machine learning system, in accordance with some implementations of the present disclosure.

FIGS. 6-7 depict flow diagrams illustrating example methods 600-700 related to training and/or using machine learning models in association with chamber data, in accordance with some implementation of the present disclosure. For simplicity of explanation, methods 600-700 are depicted and described as a series of acts. However, acts in accordance with this disclosure can occur in various orders and/or concurrently and with other acts not presented and described herein. Furthermore, not all illustrated acts may be performed to implement the methods 600-700 in accordance with the disclosed subject matter. In addition, those skilled in the art will understand and appreciate that methods 600-700 could alternatively be represented as a series of interrelated states via a state diagram or events.

FIG. 6 depicts a flow diagram of a method 600 for updating chamber control knobs after a chamber preventive maintenance event, in accordance with some implementation of the present disclosure. Method 600 is performed by processing logic that may comprise hardware (e.g., circuitry, dedicated logic, etc.), software (such as is run on a general purpose computer system or a dedicated machine) or any combination thereof. In one implementation, the method is performed using server 120 and the trained machine learning model 190 of FIG. 1, while in some other implementations, one or more blocks of FIG. 6 may be performed by one or more other machines not depicted in the figures.

Method 600 may include receiving sensor data (e.g., associated with a processing chamber performing a process procedure) and processing the sensor data using a trained machine learning model 190. The trained machine learning model (MLM) may be configured to generate, based on the sensor data, one or more outputs indicating a first update associated with the substrate processing procedure. In some embodiments, the trained MLM is configured to generate a chamber control knob update (e.g., update to one or more process parameters) associated with the substrate processing procedure.

At block 602, processing logic receives sensor data indicating a first state of an environment of a processing chamber processing a substrate. The sensor data may be provided by one or more of an OES sensor, a reflectometry spectra sensor, and/or other sensor measure various parameters such as temperature, pressure, HFRF, voltage of ESC, electrical flow, power voltage, etc. In some embodiments, the first state of the environment of the processing chamber processing the substrate occurs subsequent to a performance of a chamber recovery procedure. The chamber recovery procedure may include a seasoning procedure consisting of multiple seasoning runs (e.g., seasoning 206 of FIG. 2A).

In some embodiments, the sensor data further includes synthetic data, or data engineered from raw sensor data. For example, as described in previous embodiments, various engineering tools can perform a feature extraction and/or create artificial and/or virtual parameter combinations. A feature extractor (e.g., data preparation tool 116 of FIG. 1) can create various features by performing variable analysis such as process control analysis (PCA), univariate/multivariate statistical process control (SPC), univariate limit violation analysis, and/or multivariate limit violation analysis on raw sensor data. In some embodiments, the sensor data is normalized across multiple processing chamber and/or process recipes to create a comparable data set having a common basis.

At block 604, processing logic receives substrate process data indicating a set of process parameter values associated with performing a substrate processing procedure. The process parameter values may include one or more chamber control knob settings. In some embodiments, the substrate process data may include process duration (e.g., trim time). The substrate process data may include process data recorded in sequence. For example, the substrate process data may include a first piece of process data, followed by a second piece of process data, etc. In some embodiments, the substrate process data includes trim times of the process recorded in sequence. In some embodiments, the substrate process data includes a sequence of data indicative of a process recipe (e.g., a sequence of data indicative of a series of process recipe operations) (see FIG. 4B). In some embodiments, the substrate processing procedure is performed by the processing chamber having the environment in a second state. The second state of the processing chamber may indicate a state occurring prior to the chamber recovery procedure. The second state of the processing chamber may indicate a state of the chamber occurring subsequent to a preventive maintenance event.

At block 606, one or more MLMs process the sensor data and the substrate process data to determine one or more outputs. In some embodiments, the one or more outputs include a first update associated with performing the substrate processing procedure. The first update may be an update to one or more process parameter values. The first update may be an update to one or more chamber control knob settings. A chamber control knob setting may include an update to an operation and/or configuration of hardware and/or software elements that control one or more processing chamber parameters associated with processing one or more substrates within a processing chamber. A substrate processed using a substrate process procedure incorporating the first update may have a process result that meets a threshold condition (e.g., uniformity requirements, critical dimensions criteria, film thickness criteria, etc.) associated with the substrate processing procedure.

At block 608, processing logic prepares a notification indicating the first update. The notification may be prepared for presentation on a GUI. In some embodiments, the GUI is presented on a client device (e.g., client device 150 of FIG. 1). In some embodiments, the notification is provided to a user via the GUI.

At block 610, processing logic causes the processing chamber to perform a selection of the substrate processing procedure using the first update. In some embodiments, the selection of the substrate processing procedure may incorporate the first update. In some embodiments, the process parameters associated with the processing procedure are updated based on the first update. The chamber control knobs may be updated based on a chamber control knob update corresponding to the first update.

At block 612, in some embodiments, processing logic determines a first end point detection condition. The first end point detection condition may correspond to the first update. The first end point detection condition may indicate an end to a chamber control knob tuning procedure corresponding to the chamber processing a substrate according to a process recipe and the first update resulting in the substrate meeting a target outcome. In some embodiments, the first end point detection condition corresponds to an optical sensor measurement of a substrate processed according to the first update.

Determining the first end point condition may include applying a deterministic model to the first update. The deterministic model may generate the first end point condition based on the first update. The first end point condition may correspond to a physical measurement of a substrate processed according to the first update, and a measurement value of the physical measurement may itself correspond to the first update. For example, a thickness measurement of a substrate can be made where the measured thickness value corresponds to one or more updated parameters of the first update. The first end point condition may be generated using one or more historical process parameters (e.g., historical chamber control knob settings) and one or more historical end point detection conditions associated with the historical process parameters. For example, a machine learning model may predict the first end point condition based on the first update being given as input, the machine learning model having been trained with training input including historical process parameters and target output including historical end point detection conditions associated with the historical process parameters.

In some embodiments, the deterministic model includes a mechanistic model. The mechanistic model may be generated by performing a linear exponential regression using the historical process parameters and historical end point detection conditions associated with the historical process parameters. In some embodiments, a correlation is established between the historical process parameters and the historical end point detection conditions that allow the mechanistic model to be generated by performing the linear exponential regression.

At block 614, in some embodiments, processing logic causes the processing chamber to perform the selection of the substrate processing procedure using the first end point detection condition. The processing chamber may be caused to perform the substrate processing procedure based on the first update and/or the first end point detection condition. In some embodiments, the selection of the substrate processing procedure may incorporate the first endpoint detection condition. In some embodiments, the process parameters associated with the processing procedure are updated based on the first endpoint condition. The chamber control knobs may be updated based on a chamber control knob update corresponding to the first endpoint condition.

FIG. 7 is an exemplary illustration of a training phase of a machine learning system, in accordance with some implementation of the present disclosure. Machine learning system 170 may use method 700 to at least one of train, validate, or test a machine learning model, in accordance with embodiments of the disclosure. In some embodiments, one or more operations of method 700 may be performed by data set generator 174 of server machine 172, as described with respect to FIG. 1. It may be noted that components described with respect to FIG. 1 may be used to illustrate aspects of FIG. 7.

At block 702, processing logic initializes a training set. At block 704, processing logic identifies a first data input (e.g. first training input, first validating input). The first data input may include first training input data indicative of a first state of an environment of a first processing chamber processing a substrate subsequent to a chamber recovery procedure performed on the first processing chamber. The first data input may include first substrate process data indicating a first set of process parameter values associated with performing a first substrate processing procedure. Performing the first substrate processing procedure may be by the first processing chamber having the environment in a second state. The second state may be a state occurring prior to the chamber recovery procedure. In some embodiments, the first data input may include chamber environmental parameters (e.g., temperature, pressure, vacuum conditions, plasma conditions, optical measurements, spectroscopy conditions, etc.). The first target input may be identified from the sensor data 144 of the historical data 142 (e.g., of data store 140)

At block 706, processing logic identifies a target output for the training inputs. In some embodiments, the target output includes second substrate process data indicating a first update to at least one of the first set of process parameter values. The first update may be an update to one or more chamber control knobs associated with the first substrate processing procedure. The first update may be associated with the first processing chamber having the environment in the first state performing the first substrate processing procedure. The first target input may be identified from the sensor data 144 of the historical data 142 (e.g., of data store 140).

At block 708, processing logic optionally generates mapping data that is indicative of an input/output mapping. The input/output mapping (or mapping data) may refer to the data input (e.g., one or more of the data inputs described herein), the target output for the data input (e.g. one or more of the data inputs described herein), the target output for the data (e.g. where the target output identifies an associated chamber status), and an association between the data input(s) and the target output. The input may be based on the sensor data and the first substrate process data. The output may be based on the second substrate process data.

At block 710, processing logic adds the mapping data generated at block 704 to data set T.

At block 712, processing logic branches based on whether the data set T is sufficient for at least one of training, validating, or testing machine learning model 190. If so ("yes" branch), execution proceeds to block 714, otherwise ("no" branch), execution continues back at block 704. It should be noted that in some embodiments, the sufficiency of data set T may be determined based simply on the number of input/output mappings in the data set, while in some other embodiments, the sufficiency of data set T may be determined based on one or more other criteria (e.g., a measure of diversity of the data examples, accuracy, etc.) in addition to, or instead of, the number of input/output mappings.

At block 714, processing logic provides data set T to train, validate, or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs) are input to the neural network, and output values (e.g., numerical values associated with target outputs) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 714, machine learning model (e.g., machine learning model 190) can be at least one of trained using training engine 182 of server machine 180, validated using validating engine 184 of server machine 180, or tested using testing engine 186 of server machine 180. The trained machine learning model may be implemented by chamber status component 194 (of server machine 192) to identify a chamber control knob update (e.g., update to one or more process parameters associated with a substrate process procedure) based on received sensor data.

In some embodiments, a training dataset that was generated is used to train a machine learning model and/or a physical model. The model may be trained to receive as an input chamber sensor data. The model may output a chamber control knob update (e.g., update to one or more process parameters associated with a substrate process procedure) based on received sensor data. In embodiments, the model may be agnostic to individual processing chamber, preventive maintenance performed, and/or process recipes used in the production mode. Accordingly, the model may be generated based on training data items generated based on seasoning processes run on a first processing chamber, and may then be used for a second processing chamber without performing any transfer learning to tune the model for the second processing chamber.

In one embodiment, the trained machine learning model is a regression model trained using regression. Examples of regression models are regression models trained using linear/nonlinear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, partial least square regression, support vector regression, percentage regression, least absolute deviations, nonparametric regression, regularized regression, scenario optimization and/or distance metric learning may be performed to train the regression model. In one embodiment, the trained machine learning model, includes a support vector machine or other type of machine learning model.

In one embodiments, the trained machine learning model employs ensemble modeling. Ensemble modeling may include training multiple models (e.g., two or more related but different analytical models) and synthesizing the results of each of the models into a single score or spread (e.g., improving prediction accuracy and reducing from any one machine learning model). For example, the trained machine learning model may include a bootstrap aggregation ("bagging") model. Bagging may include an aggregation phase and a bootstrapping phase for each individual model. Bootstrapping includes sampling or creating a dataset (e.g., using method 700), where each sample (e.g., sensor data associated with performing a seasoning procedure on a processing chamber) is selected and replaced (e.g., at random) within a broader sample set. For each, as previously indicated, multiple models may be generated based on different subsets of the broader total set of training data (e.g., historical data 142). The multiple models may output results that are synthesized (e.g., aggregated) to form an overall score (e.g., overall confidence level) associated with an identified output of the ensemble of models (e.g., a predicted chamber status).

In another example, the machine learning model may include a random forest model. The machine learning model leverages multiple decision trees or types of analytical models designed to predict outputs based on different variables and rules. The random forest model may blend decisions trees that analyze different sample data, evaluate different factors, or weight common variables by different amounts. The results of the various decision trees may be converted into a synthesized result (e.g., a simple average or aggregated through further weighting) to predict a chamber control knob update based on inputted sensor data. In another example, the machine learning model may include a gradient boosting regression (GBR) model. The machine learning model leverages multiple (e.g., at least two) models to predict outputs based on different inputs. The inputs may be associated. The gradient boosting regression model may use a first model to determine a first prediction, and may use a second model to determine a delta (e.g., a difference)

between the first prediction and a target value. The outputs of the models may be combined to predict a chamber control knob update based on inputted sensor data. In some embodiments, a first regression is performed to generate a first machine learning model using a first subset of training data, and a second regression is performed to generate a second machine learning model using a second subset of training data. The accuracy of the first machine learning model may be determined to be greater than the accuracy of the second machine learning model based on a comparison of the first machine learning model, the second machine learning model, and the training data.

In one embodiment, the trained machine learning model is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

The trained machine learning model may be periodically or continuously retrained to achieve continuous learning and improvement of the trained machine learning model. The model may generate an output based on an input, an action may be performed based on the output, and a result of the action may be measured. In some instances, the result of the action is measured within seconds or minutes, and in some instances, it takes longer to measure the result of the action. For example, one or more additional processes may be performed before a result of the action can be measured. The action and the result of the action may indicate whether the output was a correct output and/or a difference between what the output should have been and what the output was. Accordingly, the action and the result of the action may be used to determine a target output that can be used as a label for the sensor measurements. Once the result of the action is determined, the input (e.g., sensor data), the output of the trained machine learning model (e.g., chamber control knob update), and the target result (e.g., target process result of a substrate) actual measured result (e.g., measured process result of a substrate) may be used to generate a new training data item. The new training data item may then be used to further train the trained machine learning model. This retraining process may be performed on-tool on the manufacturing system (e.g., processing chamber(s)) in some embodiments.

Figure 8:
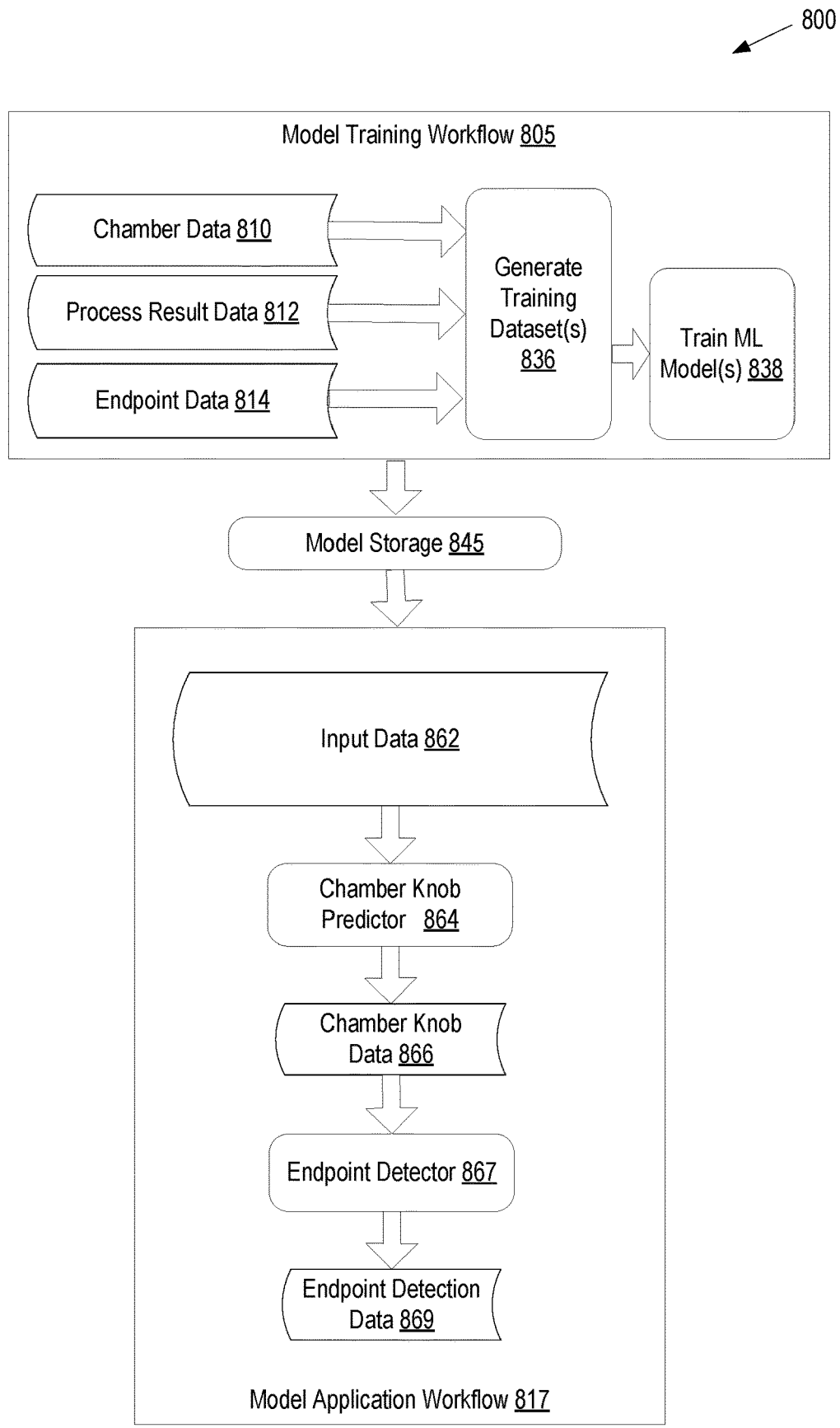
FIG. 8 illustrates a model training workflow and a model application workflow for chamber knob prediction and simulation, according to aspects of the disclosure.

FIG. 8 illustrates a model training workflow 805 and a model application workflow 817 for chamber knob prediction and simulation, according to aspects of the disclosure. In embodiments, the model training workflow 805 may be performed at a server which may or may not include an endpoint detector and/or chamber knob predictor application, and the trained models are provided to an endpoint detector and/or chamber knob predictor application, which may perform the model application workflow 817. The model training workflow 805 and the model application workflow 817 may be performed by processing logic executed by a processor of a computing device (e.g., server 120 of FIG. 1). One or more of these workflows 805, 817 may be implemented, for example, by one or more machine learning modules implemented processing device and/or other software and/or firmware executing on a processing device.

The model training workflow 805 is to train one or more machine learning models (e.g., deep learning models) to perform one or more determining, predicting, modifying, etc. tasks associated with an endpoint detector and/or chamber knob predictor (e.g., determining if one or more chamber control knobs are properly tuned and ready the processing chamber for a production mode of operation). The model application workflow 817 is to apply the one or more trained machine learning models to perform the determining and/or tuning, etc. tasks for chamber data (e.g., raw sensor data, synthetic data, indicative of a state of a processing chamber). One or more of the machine learning models may receive process result data (e.g., endpoint detection condition and/or chamber knob settings).

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting In some embodiments, one or more machine learning models are trained to perform one or more of the below tasks. Each task may be performed by a separate machine learning model. Alternatively, a single machine learning model may perform each of the tasks or a subset of the tasks. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. The tasks that the one or more trained machine learning models may be trained to perform are as follows:

a. Endpoint detector—As discussed previously, various input data such as sensor data, pre-processed data, process data, synthetic data indicative of a state of a processing chamber during a seasoning process (e.g., processing a series of seasoning wafers) may be received and processed by the endpoint detector. The endpoint detector may output various values corresponding to various endpoint detection set points for a chamber control knob tuning procedure indicating that a substrate processed according to a process procedure subsequent to chamber control knob tuning results in the substrate having a process result that meets threshold conditions associated with a substrate process (e.g., a substrate and/or manufacturing recipe).

b. Chamber knob predictor—Chamber knob predictor may receive data and generate a chamber control knob update associated with a recovery of a processing chamber subsequent to a preventive maintenance and/or a seasoning procedure. Chamber knob predictor may determine an update to one or more chamber control knobs associated with a substrate processing recipe performed in a processing chamber. For example, the chamber knob predictor may identify an update to a process parameter associated with a processing chamber corresponding to a substrate process recipe such that a substrate processed according to the substrate process recipe and/or the process parameter update results in the substrate having process results meeting threshold conditions associated with one or more process procedures.

For the model training workflow 805, a training dataset containing hundreds, thousands, tens of thousands, hundreds of thousands or more chamber data 810 (e.g., sensor data, process data, synthetic data indicative of states of associated processing chambers) should be used to form a training dataset. In some embodiments, chamber data 810 includes process recipe data. For example, chamber data 810 may include a series of process recipe durations (e.g., trim times) corresponding to a series of process recipe operations. In some embodiments, chamber data 810 includes trim times for process recipe operations recorded in sequence. In some embodiments, chamber data includes a sequence of data indicative of a process recipe (e.g., a sequence of data indicative of a series of process recipe operations) (see FIG. 4B). In some embodiments, the training dataset may also include an associated process result data 812 (e.g., measured parameters of substrate (e.g., critical dimensions, uniformity requirements, film thickness results, etc.)) for forming a training dataset, where each data point may include various labels or classifications of one or more types of useful information. In some embodiments, the training dataset may also include an associated endpoint data 814 (e.g., optical measurements associated with an endpoint to a chamber control knob tuning procedure). Each case may include, for example, data indicative of a one or more processing chamber undergoing a seasoning process and associated process results of substrates evaluated during and/or after the seasoning process. This data may be processed to generate one or multiple training datasets 836 for training of one or more machine learning models. The machine learning models may be trained, for example, to automate chamber control knob predictions (e.g., an update to one or more parameters associated with a process recipe of a processing chamber) and/or predict chamber process knob settings subsequent to a chamber seasoning procedure and/or a chamber preventive maintenance procedure.

In one embodiment, generating one or more training datasets 836 includes performing chamber recovery process 200A by performing preventive maintenance 202, seasoning 206, control knob tuning 208, and evaluating a sample test 210 to determine whether a tuning of one or more chamber control knobs meets a threshold condition (e.g., block 212). One or more labels may be used on various iterations of chamber recovery process 200A to identify the sample test 210 as meeting threshold conditions to initiate a production mode of the processing chamber, and/or initiate further chamber control knob tuning corresponding to the processing chamber. The labels that are used may depend on what a particular machine learning model will be trained to do. In some embodiments, as described in other embodiments the chamber data, process results, and/or sample test results may be represented as vectors and the process rates may be represented as one or more matrices.

To effectuate training, processing logic inputs the training dataset(s) 836 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above.

Training may be performed by inputting one or more of the chamber data 810 and process result data 812 into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include one or more modifications to plasma process data (e.g., modifications to one or more plasma exposure durations). Processing logic may cause a substrate to be processed using the updated recipe (e.g., with the identified modifications) and receive an updated thickness profile. Processing logic may compare the updated thickness profile against a target thickness profile and determine whether a threshold criterion is met (e.g., thickness values measured across a surface of the wafer fall within a target threshold value window). Processing logic determines an error (i.e., an endpoint error or knob prediction error) based on the difference between the identified chamber endpoint or knob prediction and the evaluated process result (e.g., sample test result). Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

Once one or more trained machine learning models 838 are generated, they may be stored in model storage 845, and may be added to a substrate process rate determination and/or process tuning application. Substrate process rate determination and/or process tuning application may then use the one or more trained ML models 838 as well as additional processing logic to implement an automatic mode, in which user manual input of information is minimized or even eliminated in some instances.

For model application workflow 817, according to one embodiment, input data 862 may be input into chamber knob predictor 864, which may include a trained machine learning model. Based on the input data 862, chamber knob predictor 864 may output a chamber control knob prediction. A chamber control knob prediction may be a chamber control knob setting needed for a chamber to meet the threshold condition to operate in a production operation mode (e.g., associated with a substrate processing recipe). Chamber knob data 866 may include the chamber control knob prediction.

According to one embodiments, chamber knob data 866 may be may be input into endpoint detector 867, which may include a trained machine learning model. Based on the input data 862, endpoint detector 867 outputs endpoint detection data 869. Endpoint detection data 869 may include information indicating an endpoint associated with a chamber control knob tuning process. The endpoint may indicate that the chamber control knob tuning process is complete. The endpoint may be indicative of a physical condition (e.g., a measurement or critical dimension) of a substrate corresponding to the chamber control knob tuning process being complete (e.g., the chamber control knob tuning process is complete when a substrate processed according to the outcome of the chamber control knob tuning process meets a threshold measurement or critical dimension). The endpoint may correspond with a condition that an associated substrate processed according to the chamber control knob tuning includes a first process result that meets a threshold condition of the substrate processing procedure.

Figure 9:
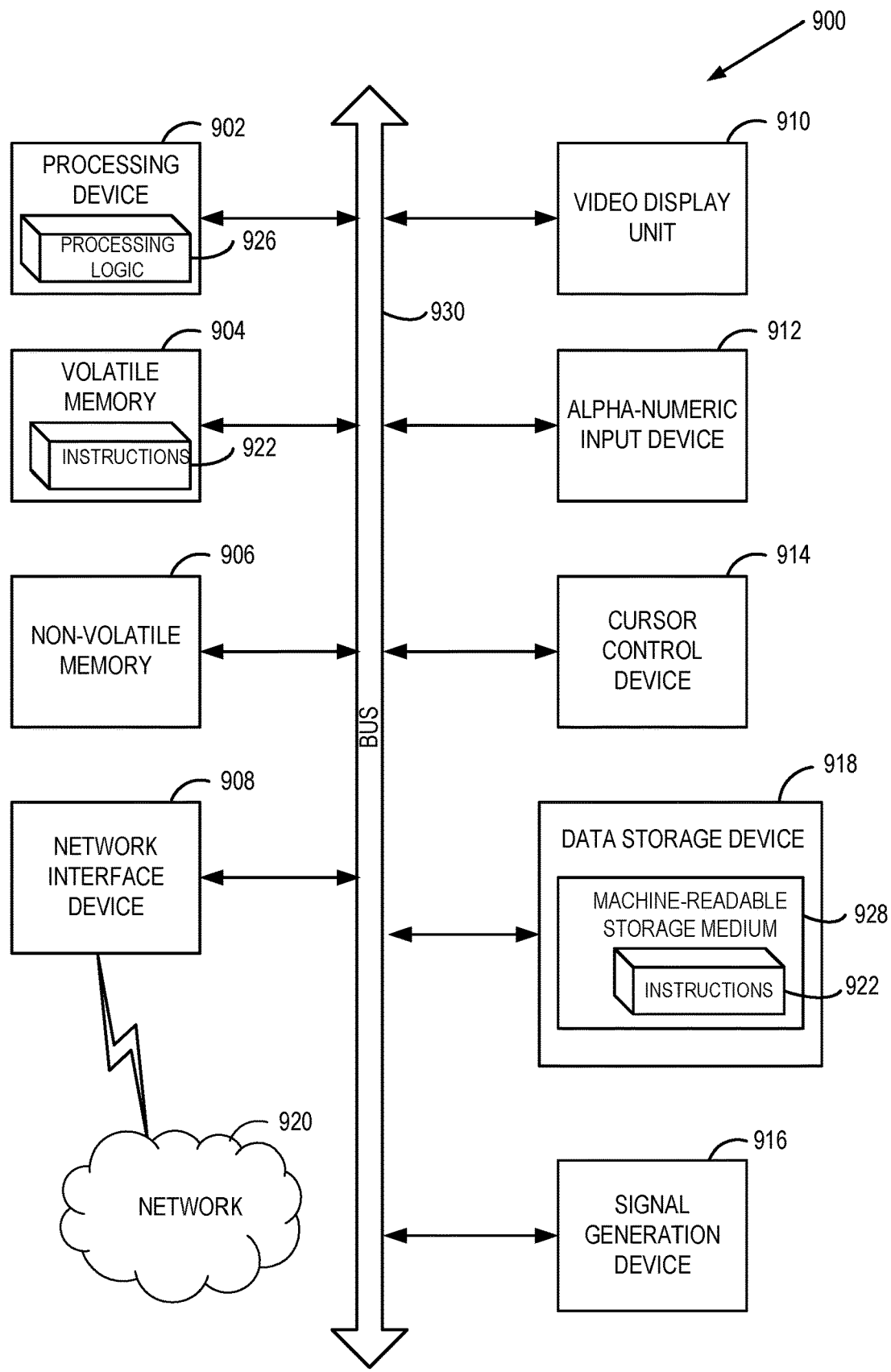
FIG. 9 depicts a block diagram of an example computing device, operating in accordance with one or more aspects of the present disclosure.

FIG. 9 depicts a block diagram of an example computing device 900, operating in accordance with one or more aspects of the present disclosure. In various illustrative examples, various components of the computing device 900 may represent various components of the client devices 150, metrology system 110, server, 120, data store 140, and machine learning system 170, illustrated in FIG. 1.

Example computing device 900 may be connected to other computer devices in a LAN, an intranet, an extranet, and/or the Internet. Computing device 900 may operate in the capacity of a server in a client-server network environment. Computing device 900 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 900 may include a processing device 902 (also referred to as a processor or CPU), a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 918), which may communicate with each other via a bus 930.

Processing device 902 represents one or more general-purpose processing devices such as a microprocessor, central processing unit, or the like. More particularly, processing device 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 902 may be configured to execute instructions implementing methods 600, 700 illustrated in FIGS. 6-7.

Example computing device 900 may further comprise a network interface device 908, which may be communicatively coupled to a network 920. Example computing device 900 may further comprise a video display 910 (e.g., a liquid crystal display (LCD), a touch screen, or a cathode ray tube (CRT)), an alphanumeric input device 912 (e.g., a keyboard), a cursor control device 914 (e.g., a mouse), and an acoustic signal generation device 916 (e.g., a speaker).

Data storage device 918 may include a computer-readable storage medium (or, more specifically, a non-transitory machine-readable storage medium) 928 on which is stored one or more sets of executable instructions 922. In accordance with one or more aspects of the present disclosure, executable instructions 922 may comprise executable instructions associated with executing methods 600, 700 illustrated in FIGS. 6-7.

Executable instructions 922 may also reside, completely or at least partially, within main memory 904 and/or within processing device 902 during execution thereof by example computing device 900, main memory 904 and processing device 902 also constituting computer-readable storage media. Executable instructions 922 may further be transmitted or received over a network via network interface device 908.

While the computer-readable storage medium 928 is shown in FIG. 9 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed:

1. A method, comprising:
receiving, by a processing device, (i) sensor data indicating a first state of a coating of a processing chamber processing a substrate subsequent to a chamber recovery procedure performed on the processing chamber and (ii) substrate process data indicating a set of process parameter values associated with performing a substrate processing procedure by the processing chamber having the coating in a second state prior to the chamber recovery procedure;
processing the sensor data and the substrate process data using one or more machine learning models (MLMs) to determine one or more outputs, the one or more outputs comprising a first update to at least one of the set of process parameter values, wherein the first update is associated with performing the substrate processing procedure by the processing chamber having the coating in the first state; and
performing, by the processing device, at least one of a) preparing a notification indicating the first update for presentation on a graphical user interface (GUI) or b) causing the processing chamber to perform a selection of the substrate processing procedure based on the first update.

2. The method of claim 1, further comprising:
determining a first end point detection condition corresponding to the first update; and
causing the processing chamber to perform the selection of the substrate processing procedure using the first end point detection condition.

3. The method of claim 2, wherein the first end point detection condition corresponds to an optical sensor measurement of the coating of the processing chamber.

4. The method of claim 2, wherein determining the first end point detection condition comprises:

applying a deterministic model to the first update to generate the first end point detection condition, wherein the deterministic model is generated using one or more historical process parameters and one or more historical end point detection conditions associated with the one or more historical process parameters.

5. The method of claim 4, wherein the deterministic model comprises a mechanistic model generated by performing at least a linear exponential regression using the one or more historical process parameters and the one or more historical end point detection conditions.

6. The method of claim 1, wherein:
the substrate processing procedure comprises a plurality of process operations;
a first value of the set of process parameter values corresponds to a first process operation of the plurality of process operations;
the first update corresponds to the first value;
a second value of the set of process parameter values corresponds to a second process operation of the plurality of process operations; and
the one or more outputs further comprises a second update corresponding to the second value.

7. The method of claim 6, the method further comprising:
determining a first end point detection condition corresponding to the first process operation and the processing chamber based on the first update;
determining a second end point detection condition corresponding to the second process operation and the processing chamber based on the second update; and
causing the processing chamber to perform the selection of the substrate processing procedure using the first end point detection condition and the second end point detection condition.

8. The method of claim 1, wherein processing the sensor data and the substrate process data further comprises:
processing, using a first MLM of the one or more MLMs, the sensor data and the substrate process data to obtain a first model output;
processing, using a second MLM of the one or more MLMs, the first model output to obtain a second model output; and
determining the first update based on a combination of at least the first model output with the second model output.

9. The method of claim 1 wherein at least one of the one or more MLMs is trained using at least one of least absolute shrinkage and selection operator (LASSO) regression or Ridge regression.

10. The method of claim 1, wherein the chamber recovery procedure comprises a chamber seasoning procedure performed subsequent to a preventive maintenance (PM) procedure.

11. The method of claim 1, wherein the set of process parameter values comprises one or more values indicating at least one of process temperature, process pressure, or process duration.

12. A method, comprising:
receiving, by a processing device, training data comprising (i) first sensor data indicating a first state of a coating of a first processing chamber processing a substrate subsequent to a chamber recovery procedure performed on the first processing chamber, (ii) first substrate process data indicating a first set of process parameter values associated with performing a first substrate processing procedure by the first processing chamber having the coating in a second state prior to the chamber recovery procedure, and (iii) second substrate process data indicating a first update to at least one of the first set of process parameter values, wherein the first update is associated with performing the first substrate processing procedure by the first processing chamber having the coating in the first state; and
training, by the processing device, one or more machine learning models (MLMs) with (i) input data comprising the first sensor data and the first substrate process data and (ii) target output comprising the second substrate process data, wherein the one or more trained MLMs are to receive a new input having new sensor data indicating a third state of the coating of a new processing chamber processing a new substrate subsequent to the chamber recovery procedure and third substrate process data indicating a second set of process parameter values associated with performing the first substrate processing procedure by the new processing chamber having the coating in a fourth state prior to the chamber recovery procedure to produce a new output based on the new input, the new output indicating a second update to at least one of the second set of process parameter values, wherein the second update is associated with performing the first substrate processing procedure by the new processing chamber having the coating in the third state.

13. The method of claim 12, further comprising:
causing a first regression to be performed using a first subset of training data to generate a first MLM;
causing a second regression to be performed using a second subset of training data to generate a second MLM; and
determining that a first accuracy of the first MLM is greater than a second accuracy of the second MLM based on a comparison of the first MLM, the second MLM, and the training data, wherein the trained one or more MLMs comprise the first MLM.

14. The method of claim 12, wherein training the one or more MLMs further comprises performing a gradient boosting regression (GBR) using the training data.

15. The method of claim 12, wherein:
the first substrate processing procedure comprises a series of process operations, wherein each of the second set of process parameter values is associated with one of the series of process operations;
the second update indicates an update to a first process parameter value of the second set of process parameter values, the first process parameter value corresponding to a first process operation of the series of process operations; and
the new output further indicates a third update to a second process parameter value of the second set of process parameter values, the second process parameter value corresponding to a second process operation of the series of process operations.

* * * * *